United States Patent
Bai et al.

(10) Patent No.: US 10,847,416 B2
(45) Date of Patent: Nov. 24, 2020

(54) SEMICONDUCTOR DEVICE INCLUDING SELF-ALIGNED CONTACT AND METHOD OF FABRICATING THE SEMICONDUCTOR DEVICE

(71) Applicant: Samsung Electronics Co., Ltd., Suwon-si (KR)

(72) Inventors: Keun Hee Bai, Suwon-si (KR); Sung Woo Kang, Suwon-si (KR); Kee Sang Kwon, Hwaseong-si (KR); Dong Seok Lee, Hwaseong-si (KR); Sang Hyun Lee, Hwaseong-si (KR); Jeong Yun Lee, Hwaseong-si (KR); Yong-Ho Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/176,943

(22) Filed: Oct. 31, 2018

(65) Prior Publication Data

US 2019/0295889 A1 Sep. 26, 2019

(30) Foreign Application Priority Data

Mar. 22, 2018 (KR) .......................... 10-2018-0033286

(51) Int. Cl.
*H01L 21/768* (2006.01)
*H01L 21/8234* (2006.01)
(Continued)

(52) U.S. Cl.
CPC .. *H01L 21/76897* (2013.01); *H01L 21/76804* (2013.01); *H01L 21/76831* (2013.01); *H01L 21/823431* (2013.01); *H01L 21/823475* (2013.01); *H01L 29/517* (2013.01); *H01L 29/66545* (2013.01)

(58) Field of Classification Search
None
See application file for complete search history.

(56) References Cited

U.S. PATENT DOCUMENTS 5,933,755 A 8/1999 Lee
6,291,355 B1 9/2001 Liu et al.
(Continued)

FOREIGN PATENT DOCUMENTS

JP 2001-035920 A 2/2001
KR 10-2001-0096349 A 11/2001
(Continued)

*Primary Examiner* — Long Pham
(74) *Attorney, Agent, or Firm* — Muir Patent Law, PLLC

(57) ABSTRACT

A semiconductor device with improved product reliability and a method of fabricating the semiconductor are provided. The semiconductor device includes a substrate, a gate electrode on the substrate, a first spacer on a sidewall of the gate electrode, a conductive contact on a sidewall of the first spacer to protrude beyond a top surface of the gate electrode, a trench defined by the top surface of the gate electrode, a top surface of the first spacer, and sidewalls of the contact, an etching stop layer extending along at least parts of sidewalls of the trench and a bottom surface of the trench, and a capping pattern on the etching stop layer to fill the trench, wherein the capping pattern includes silicon oxide or a low-k material having a lower permittivity than silicon oxide.

20 Claims, 32 Drawing Sheets

(51) Int. Cl.
*H01L 29/66* (2006.01)
*H01L 29/51* (2006.01)

(56) References Cited

U.S. PATENT DOCUMENTS

| | | |
|---|---|---|
| 6,316,349 B1 | 11/2001 | Kim et al. |
| 6,562,651 B2 | 5/2003 | Chung et al. |
| 7,205,232 B2 | 4/2007 | Yun et al. |
| 7,799,643 B2 | 9/2010 | Kang et al. |
| 8,900,944 B2 | 12/2014 | Jeong et al. |
| 9,704,745 B2 | 7/2017 | Bai et al. |
| 2016/0233310 A1* | 8/2016 | Lee .................... H01L 29/6656 |

FOREIGN PATENT DOCUMENTS

| | | |
|---|---|---|
| KR | 10-0321733 B1 | 1/2002 |
| KR | 10-0324015 B1 | 9/2002 |
| KR | 10-1062835 B1 | 9/2011 |

\* cited by examiner

SEMICONDUCTOR DEVICE INCLUDING SELF-ALIGNED CONTACT AND METHOD OF FABRICATING THE SEMICONDUCTOR DEVICE

This application claims priority under 35 U.S.C. § 119 to Korean Patent Application No. 10-2018-0033286, filed on Mar. 22, 2018, the disclosure of which is incorporated herein by reference in its entirety.

BACKGROUND

1. Technical Field

The present disclosure relates to a semiconductor device and a method of fabricating the same, and more particularly, to a semiconductor device including a self-aligned contact (SAC) and a method of fabricating the semiconductor device.

2. Description of the Related Art

A self-aligned contact (SAC) process is used to form contact holes of a semiconductor device.

However, as a semiconductor device becomes highly integrated, a short circuit becomes highly likely to occur during the SAC process because of lack of selectivity between films. For example, during the formation of a contact hole for forming a source/drain contact of a transistor using the SAC process, a short circuit may occur between a gate and the source/drain contact because of lack of selectivity between films.

SUMMARY

Exemplary embodiments of the present disclosure provide a semiconductor device capable of preventing a short circuit between a gate and a contact so as to improve product reliability.

Exemplary embodiments of the present disclosure also provide a method of fabricating a semiconductor device capable of preventing a short circuit between a gate and a contact so as to improve product reliability.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to certain exemplary embodiments of the present disclosure, a semiconductor device comprises a substrate, a gate electrode on the substrate, a first spacer on a sidewall of the gate electrode, a conductive contact on a sidewall of the first spacer to protrude beyond a top surface of the gate electrode, a trench defined by the top surface of the gate electrode, a top surface of the first spacer, and sidewalls of the contact, an etching stop layer extending along at least parts of sidewalls of the trench and a bottom surface of the trench, and a capping pattern on the etching stop layer to fill the trench, wherein the capping pattern includes silicon oxide or a low-k material having a lower permittivity than silicon oxide.

According to the aforementioned and other exemplary embodiments of the present disclosure, a semiconductor device comprises a substrate, an interlayer insulating film formed on the substrate and including a trench, which has lower and upper portions, a gate electrode filling the lower portion of the trench, an etching stop layer extending along at least a first sidewall of the upper portion of the trench and along a top surface of the gate electrode, a capping pattern formed on the etching stop layer and filling the upper portion of the trench, and a conductive contact formed on a sidewall of the gate electrode and on a sidewall of the capping pattern, the contact penetrating the interlayer insulating film, wherein the etching stop layer extends at least partially along parts of sidewalls of the conductive contact, and the capping pattern includes silicon oxide or a low-k material having a lower permittivity than silicon oxide.

According to the aforementioned and other exemplary embodiments of the present disclosure, a semiconductor device comprises a substrate, a gate electrode on the substrate, a gate spacer on a sidewall of the gate electrode, a capping pattern covering a top surface of the gate electrode and a top surface of the gate spacer, an interlayer insulating film formed on the substrate and adjacent to the gate spacer and the capping pattern, and a conductive contact penetrating the interlayer insulating film, and defined by a sidewall of the gate spacer and a sidewall of the capping pattern. The capping pattern and the interlayer insulating film include substantially the same material, and a sidewall of the capping pattern adjacent to the contact includes a first sidewall portion and a second sidewall portion, which is formed above the first sidewall portion and has a smaller slope than the first sidewall portion.

According to the aforementioned and other exemplary embodiments of the present disclosure, a method of fabricating a semiconductor device comprises forming a gate electrode on a substrate, forming an interlayer insulating film to surround the gate electrode, forming a first trench, which is defined by sidewalls of the interlayer insulating film and a top surface of the gate electrode, by recessing an upper part of the gate electrode, forming a mask pattern, which includes a semiconductor material, to fill the first trench, forming a conductive contact on a sidewall of the gate electrode and a sidewall of the mask pattern to penetrate the interlayer insulating film, and replacing the mask pattern with a capping pattern.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Semiconductor devices according to some exemplary embodiments of the present disclosure will hereinafter be described with reference to FIGS. 1 through 16.

Figure 1:
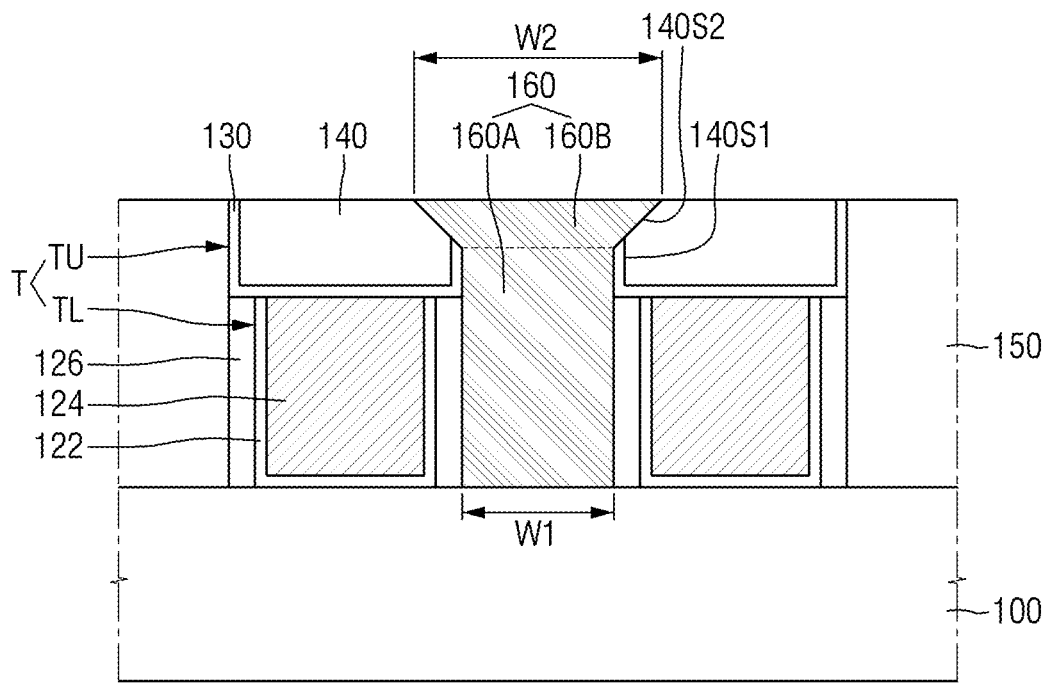
FIG. 1 is a cross-sectional view of a semiconductor device according to some exemplary embodiments of the present disclosure.

FIG. 1 is a cross-sectional view of a semiconductor device according to some exemplary embodiments of the present disclosure.

Referring to FIG. 1, the semiconductor device according to some exemplary embodiments of the present disclosure includes a substrate 100, a gate insulating film 122, gate electrodes 124, gate spacers 126, an etching stop layer 130, capping patterns 140, a first interlayer insulating film 150, and a contact 160.

The substrate 100 may include, for example, bulk silicon or a silicon-on-insulator (SOI). The substrate 100 may be a silicon substrate or may include another material such as, for example, silicon germanium, indium antimonide, a lead tellurium compound, indium arsenide, indium phosphide, gallium arsenide, or gallium antimonide. Alternatively, the substrate 100 may be a base substrate having an epitaxial layer formed thereon.

The first interlayer insulating film 150 may be formed on the substrate 100. The first interlayer insulating film 150 may surround the gate electrodes 124 and the capping patterns 140. For example, the first interlayer insulating film 150 may include trenches T, and the gate electrodes 124 and the capping patterns 140 may be formed in the trenches T.

The first interlayer insulating film 150 may include at least one of, for example, silicon oxide, silicon nitride, silicon oxynitride, and a low-k material having a lower permittivity than silicon oxide. The low-k material may include at least one of, for example, flowable oxide (FOX), torene silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), xerogel, aerogel, amorphous fluorinated carbon, organosilicate glass (OSG), parylene, bis-benzocyclobutene (BCB), SiLK, polyimide, a porous polymeric material, and a combination thereof, but the present disclosure is not limited thereto.

The gate spacers 126 may be formed on the substrate 100 and the first interlayer insulating film 150. For example, the gate spacers 126 may be formed along sidewalls of the first interlayer insulating film 150 on the substrate 100. The gate spacers 126 may define the trenches T.

In some exemplary embodiments, the top surfaces of the gate spacers 126 may be lower than the top surface of the first interlayer insulating film 150. Accordingly, the gate spacers 126 may define the trenches T, which include lower portions TL and upper portions TU. For example, the lower portions TL of the trenches T may be defined by the top surface of the substrate 100 and sidewalls of the gate spacers 126. For example, the upper portions TU of the trenches T may be defined by the top surfaces of the gate electrodes 124, the top surface of the gate insulating film 122, the top surfaces of the gate spacers 126, and the sidewalls of the first interlayer insulating film 150.

The gate spacers 126 are illustrated as being single-layer films, but the present disclosure is not limited thereto. For example, alternatively, the gate spacers 126 may be multi-layer films.

The gate spacers 126 may include at least one of, for example, silicon nitride (SiN), silicon oxynitride (SiON), silicon oxide ($SiO_2$), silicon oxycarbonitride (SiOCN), and a combination thereof.

The gate insulating film 122 may be interposed between the substrate 100 and the gate electrodes 124. The gate insulating film 122 may be formed in the lower portions TL of the trenches T. For example, the gate insulating film 122 may extend along the profiles of the lower portions TL of the trenches T. Accordingly, the gate insulating film 122 may extend along the top surface of the substrate 100 and sidewalls of the gate spacers 126. Alternatively, the gate insulating film 122 may extend along the top surface of the substrate 100, but not along sidewalls of the gate spacers 126.

The gate insulating film 122 may include at least one of, for example, silicon oxide, silicon oxynitride, silicon nitride, and a high-k material having a higher permittivity than silicon oxide. The high-k material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof.

The gate electrodes 124 may be formed on the gate insulating film 122. The gate electrodes 124 may be formed in the lower portions TL of the trenches T. For example, the gate electrodes 124 may fill parts of the lower portions TL of the trenches T that are not filled by the gate insulating film 122. Accordingly, the gate insulating film 122 may extend along the bottom surface and the sidewalls of each of the gate electrodes 124.

The gate electrodes 124 may include a conductive material. For example, the gate electrodes 124 may include a metal layer. For example, the gate electrodes 124 may include at least one of Ti, Ta, W, Al, Co, and a combination thereof, but the present disclosure is not limited thereto. In another example, the gate electrodes 124 may be formed of silicon or silicon germanium, rather than a metal.

The gate electrodes 124 are illustrated as being single-layer films, but the present disclosure is not limited thereto. For example, the gate electrodes 124 may be formed by stacking a plurality of conductive materials. For example, the gate electrodes 124 may include work function controlling films controlling a work function and filling conductive films filling gaps formed by the work function controlling films. The work function controlling films may include at least one of, for example, TiN, TaN, TiC, TaC, TiAlC, and a combination thereof. The filling conductive films may include, for example, W or Al.

The gate electrodes 124 may be formed by, for example, a replacement process, but the present disclosure is not limited thereto.

The etching stop layer 130 may be formed on the gate electrodes 124. In some exemplary embodiments, the etching stop layer 130 may be formed in the upper portions TU of the trenches T. For example, the etching stop layer 130 may extend along the profiles of the upper portions TU of the trenches T. For example, the etching stop layer 130 may extend along the top surfaces of the gate electrodes 124, the top surface of the gate insulating film 122, the top surfaces of the gate spacers 126, and the sidewalls of the first interlayer insulating film 150.

In some exemplary embodiments, the etching stop layer 130 may extend at least partially along the sidewalls of the contact 160. For example, parts of the etching stop layer 130 may be interposed between the capping patterns 140 and the contact 160.

The etching stop layer 130 may protect the gate electrodes 124 or the contact 160 from etching. The etching stop layer 130 may include at least one of, for example, aluminum nitride, aluminum oxide, silicon oxide, silicon nitride, and a combination thereof.

The capping patterns 140 may cover the top surfaces of the gate electrodes 124 and the top surfaces of the gate spacers 126. Also, the capping patterns 140 may fill the trenches T (e.g., upper portions TU of the trenches T), which are defined by the top surfaces of the gate electrodes 124, the top surfaces of the gate spacers 126, the sidewalls of the first interlayer insulating film 150, and the sidewalls of the contact 160.

In some exemplary embodiments, the capping patterns 140 may be formed on the etching stop layer 130. Also, the capping patterns 140 may be formed in the upper portions TU of the trenches T. For example, the capping patterns 140 may fill parts of the upper portions TU that are not filled by the etching stop layer 130. Accordingly, the etching stop layer 130 may extend at least partially along the sidewalls and the bottom surface of each of the capping patterns 140.

In some exemplary embodiments, sidewalls of the capping patterns 140 adjacent to the contact 160 may have multiple slopes. For example, the sidewalls of the capping patterns 140 adjacent to the contact 160 may include first sidewall portions 140S1 and second sidewall portions 140S2, which are disposed above the first sidewall portions 140S1 and have a smaller slope than the first sidewall portions 140S1. This will be described later in detail with reference to FIGS. 24 through 28A. Accordingly, the capping patterns 140 can secure a sufficiently large distance between the gate electrodes 124 and the contact 160 and can thus reduce a leakage current between the gate electrodes 124 and the contact 160.

The first sidewall portions 140S1 of the capping patterns 140 may be substantially perpendicular to the top surface of the substrate 100, and the second sidewall portions 140S2 of the capping patterns 140 may be inclined with respect to the top surface of the substrate 100. However, the present disclosure is not limited to this. For example, the first sidewall portions 140S1 may also be inclined with respect to the top surface of the substrate 100.

The capping patterns 140 may include, for example, a low-k material. Accordingly, the capping patterns 140 can effectively reduce parasitic capacitance or a leakage current between the gate electrodes 124 and the contact 160. For example, the capping patterns 140 may include silicon oxide or a low-k material having a lower permittivity than silicon oxide. In some exemplary embodiments, the capping patterns 140 may include substantially the same material as the first interlayer insulating film 150.

The contact 160 may be formed on the substrate 100 and the gate spacers 126. The contact 160 may protrude beyond the top surfaces of the gate electrodes 124. Since the capping patterns 140 are disposed on the gate electrodes 124, the contact 160 may be formed on sidewalls of the gate spacers 126 and on sidewalls of the capping patterns 140. Part of the contact 160 may be formed on and may contact the etch stop layer 130, and part of the contact 160 may contact the gate spacers 126. It will be understood that when an element is referred to as being "on" another element, it can be directly on the other element or intervening elements may be present. In contrast, when an element is referred to as "directly on" or "contacting" another element, there are no intervening elements present. Other words used to describe the relationship between elements should be interpreted in a like fashion (e.g., "between" versus "directly between," "adjacent" versus "directly adjacent," etc.).

The contact 160 may penetrate the first interlayer insulating film 150. For example, the contact 160 may penetrate the first interlayer insulating film 150 to extend along sidewalls of the gate spacers 126 and along sidewalls of the capping patterns 140. As can be seen in FIG. 1, a shape of the sidewalls of the contact 160 may follow a shape of the sidewalls (e.g., first and second sidewall portions 140S1 and 140S2) of the capping patterns 140.

The contact 160 may be formed by a self-aligned contact (SAC) process. For example, the sidewalls of the contact 160 may be defined by sidewalls of the capping patterns 140 and sidewalls of the gate spacers 126. For example, the gate spacers 126 may include a material having etching selectivity with respect to the first interlayer insulating film 150.

However, in some exemplary embodiments, the capping patterns 140 may include a material having no etching selectivity with respect to the first interlayer insulating film 150. For example, the capping patterns 140 may include silicon oxide or a low-k material having a lower permittivity than silicon oxide. In another example, the capping patterns 140 may include substantially the same material as the first interlayer insulating film 150.

Since the sidewalls of the capping patterns 140 adjacent to the contact 160 include the first sidewall portions 140S1 and the second sidewalls portions 140S2, the contact 160 may include an extension portion 160A and an expanded portion 160B, which has a different width from the extension portion 160A. The extension portion 160A of the contact 160 may be disposed on sidewalls of the gate spacers 126 and on the first sidewall portions 140S1 of the capping patterns 140 (e.g., with the etching stop layer 130 formed therebetween). The expanded portion 160B of the contact 160 may be disposed on the second sidewall portions 140S2 of the capping patterns 140.

Since the second sidewall portions 140S2 of the capping patterns 140 have a smaller slope than the first sidewall portions 140S1 of the capping patterns 140, the width of the expanded portion 160B may be greater than the width of the extension portion 160A. For example, the width of the extension portion 160A may be substantially uniform regardless of the distance from the top surface of the substrate 100. On the other hand, the width of the expanded portion 160B may gradually increase away from the top surface of the substrate 100. Accordingly, a width W2 of the top surface of the expanded portion 160B may be greater than a width W1 of the bottom surface of the extension portion 160A.

Figure 2:
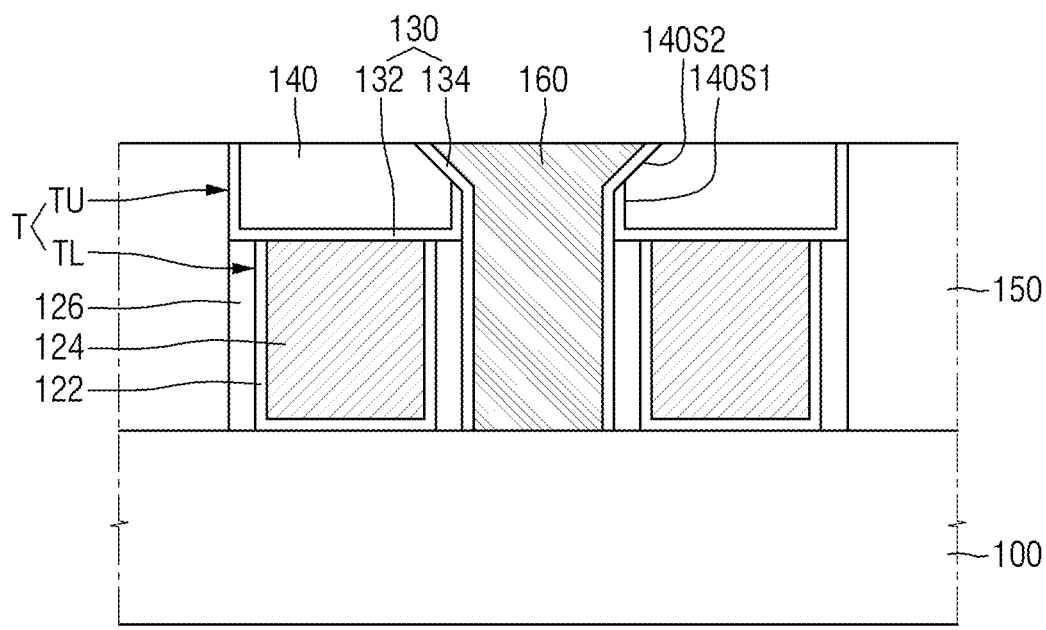
FIG. 2 is a cross-sectional view of a semiconductor device according to some exemplary embodiments of the present disclosure.

FIG. 2 is a cross-sectional view of a semiconductor device according to some exemplary embodiments of the present disclosure. For convenience, descriptions of elements or features that are the same as their respective counterparts of FIG. 1 will be omitted or at least simplified.

Referring to FIG. 2, an etching stop layer 130 extends further than the etching stop layer 130 of FIG. 1 along second sidewall portions 140S2 of capping patterns 140 and along sidewalls of gate spacers 126. For example, the etching stop layer 130 may include first and second films 132 and 134.

The first film 132 may extend along parts of sidewalls of the capping patterns 140 and along the bottom surfaces of the capping patterns 140. For example, the first film 132 may extend along parts of the sidewalls of a contact 160, the top surfaces of gate electrodes 124, the top surface of a gate insulating film 122, the top surfaces of the gate spacers 126, and sidewalls of a first interlayer insulating film 150. The first film 132 may also be formed on first sidewall portions 140S1 of the capping patterns 140, and in some embodiments does not contact first sidewall portions 140S1 of the capping patterns 140. In the embodiment shown in FIG. 2, the first film 132 is not formed on the second sidewall portions 140S2 of the capping patterns 140.

The second film 134 may extend along the sidewalls of the contact 160. For example, the second film 134 may extend along and may contact sidewalls of the gate spacers 126 and may extend along and contact the first sidewall portions 140S1 and the second sidewall portions 140S2 of the capping patterns 140.

Accordingly, the etching stop layer 130 may extend along and may contact the sidewalls of the contact 160 and may extend along and contact the top surfaces of the gate electrodes 124.

In some exemplary embodiments, a part of the second film 134 may overlap with a part of the first film 132. As illustrated in FIG. 2, parts of the first and second films 132 and 134 may be sequentially stacked on the first sidewall portions 140S1 of the capping patterns 140.

Alternatively, the second film 134 may extend along the bottom surface of the contact 160. Still alternatively, the second film 134 may not extend along the second sidewall portions 140S2 of the capping patterns 140. In some embodiments, instead of the second film 134, the first film 132 may continue to extend along and contact the second sidewall portions 140S2 of the capping patterns 140. In other embodiments, neither the first film 132 nor the second film 134 extend along the second sidewall portions 140S2 of the capping patterns 140.

Figure 3:
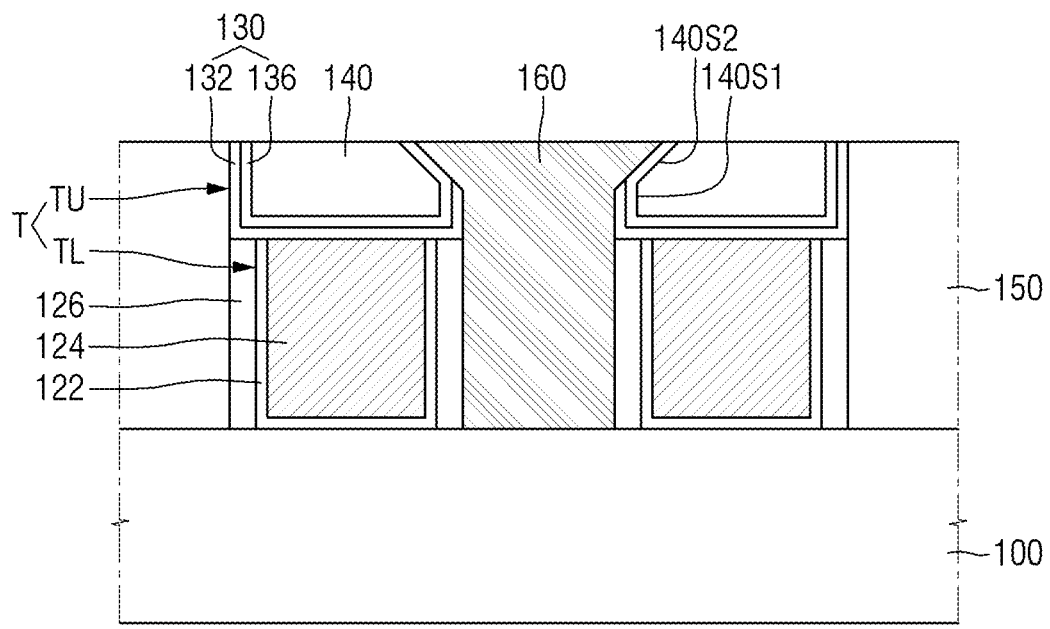
FIG. 3 is a cross-sectional view of a semiconductor device according to some exemplary embodiments of the present disclosure.

FIG. 3 is a cross-sectional view of a semiconductor device according to some exemplary embodiments of the present disclosure. For convenience, descriptions of elements or features that are the same as their respective counterparts of any of FIGS. 1 and 2 will be omitted or at least simplified.

Referring to FIG. 3, an etching stop layer 130 extends further than the etching stop layer 130 of FIG. 1 along second sidewall portions 140S2 of capping patterns 140. For example, the etching stop layer 130 may include first and third films 132 and 136.

The third film 136 may extend along the bottom surfaces of the capping patterns 140 and along sidewalls of the capping patterns 140. For example, the third film 136 may extend along the bottom surfaces of the capping patterns 140, along sidewalls of the capping patterns 140 adjacent to a contact 160 (for example, first sidewall portions 140S1 and the second sidewall portions 140S2), and along sidewalls of the capping patterns 140 adjacent to a first interlayer insulating film 150.

Accordingly, the etching stop layer 130 may extend along parts of the sidewalls of the contact 160 and along the top surfaces of gate electrodes 124.

In some exemplary embodiments, the third film 136 may be formed on the first film 132. Since the first film 132 is not formed on the second sidewall portions 140S2 of the capping patterns 140, the contact 160 and the third film 136 may contact each other. It should be noted that the term "contact" as used herein, refers to a direct connection of two components (i.e., touching), unless the context clearly indicates otherwise.

Figure 4:
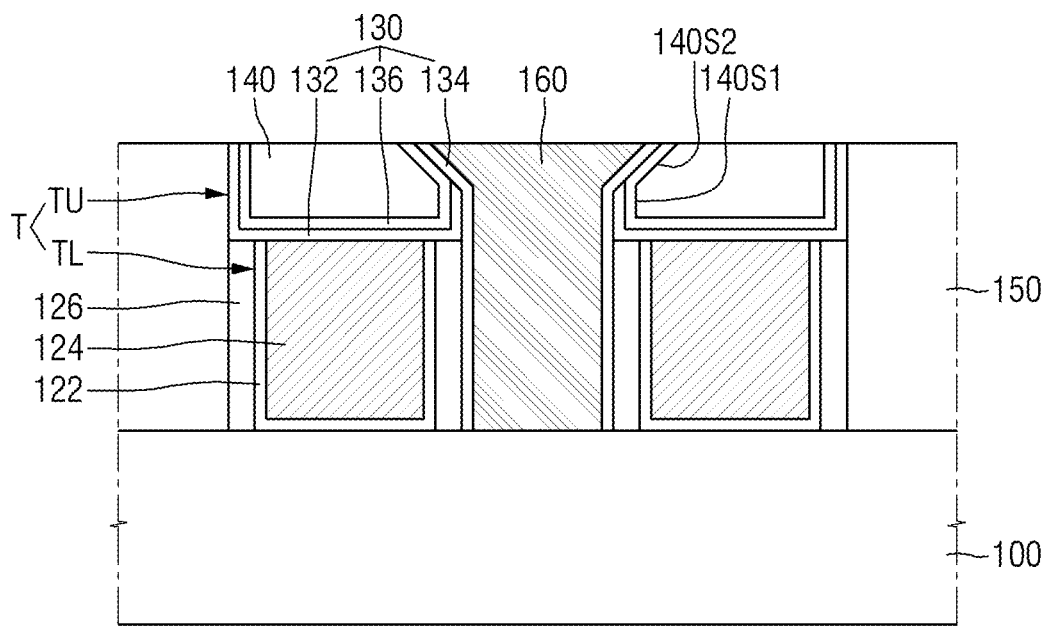
FIG. 4 is a cross-sectional view of a semiconductor device according to some exemplary embodiments of the present disclosure.

FIG. 4 is a cross-sectional view of a semiconductor device according to some exemplary embodiments of the present disclosure. For convenience, descriptions of elements or features that are the same as their respective counterparts of any of FIGS. 1 through 3 will be omitted or at least simplified.

Referring to FIG. 4, an etching stop layer 130 extends further than the etching stop layer 130 of FIG. 1 along second sidewall portions 140S2 of capping patterns 140 and along sidewalls of gate spacers 126. For example, the etching stop layer 130 may include first, second, and third films 132, 134, and 136.

Accordingly, the etching stop layer 130 may extend along the sidewalls of a contact 160 and along the top surfaces of gate electrodes 124.

In some exemplary embodiments, a part of the first film 132 may be interposed between the second and third films 134 and 136. Since the first film 132 is not formed on the second sidewall portions 140S2 of the capping patterns 140, the second and third films 134 and 136 may contact each other. As illustrated in FIG. 4, parts of the third and second films 136 and 134 may be sequentially stacked on the second sidewall portions 140S2 of the capping patterns 140.

In some exemplary embodiments, a part of the second film 134 may overlap with parts of the first and third films 132 and 136. As illustrated in FIG. 4, parts of the third, first, and second films 136, 132, and 134 may be sequentially stacked on first sidewall portions 140S1 of the capping patterns 140.

Figure 5:
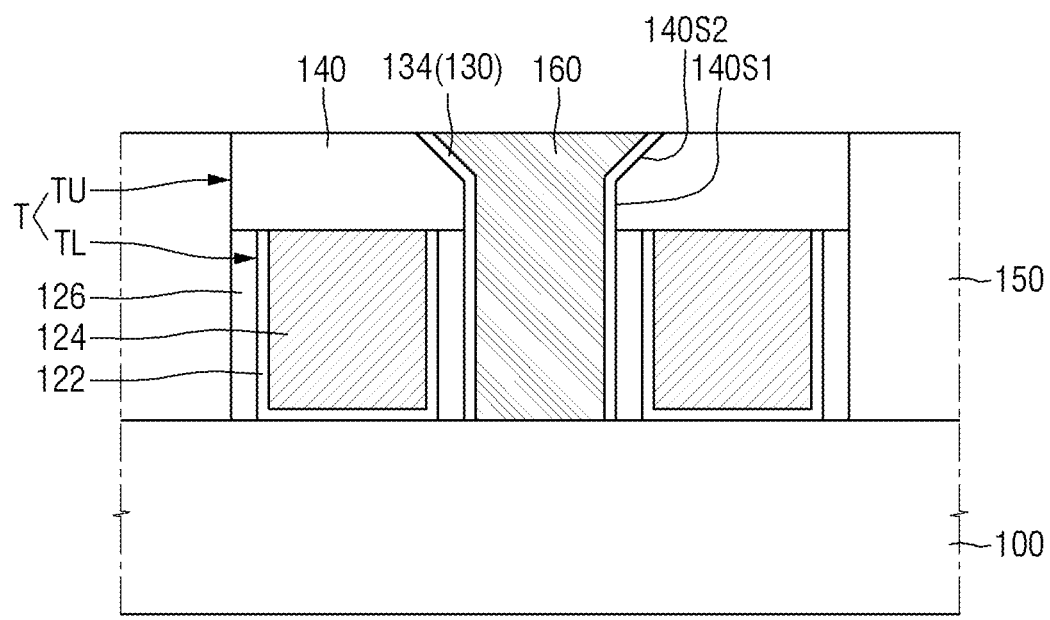
FIG. 5 is a cross-sectional view of a semiconductor device according to some exemplary embodiments of the present disclosure.

FIG. 5 is a cross-sectional view of a semiconductor device according to some exemplary embodiments of the present disclosure. For convenience, descriptions of elements or features that are the same as their respective counterparts of any of FIGS. 1 through 4 will be omitted or at least simplified.

Referring to FIG. 5, an etching stop layer 130, unlike the etching stop layer 130 of FIG. 2, does not extend along the top surfaces of gate electrodes 124. For example, the etching stop layer 130 may only include a second film 134.

Accordingly, the etching stop layer 130 may extend along the sidewalls of a contact 160.

In some exemplary embodiments, since no first film 132 is formed, the second film 134 may contact first sidewall portions 140S1 and second sidewall portions 140S2 of capping patterns 140. It should be noted that although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 6:
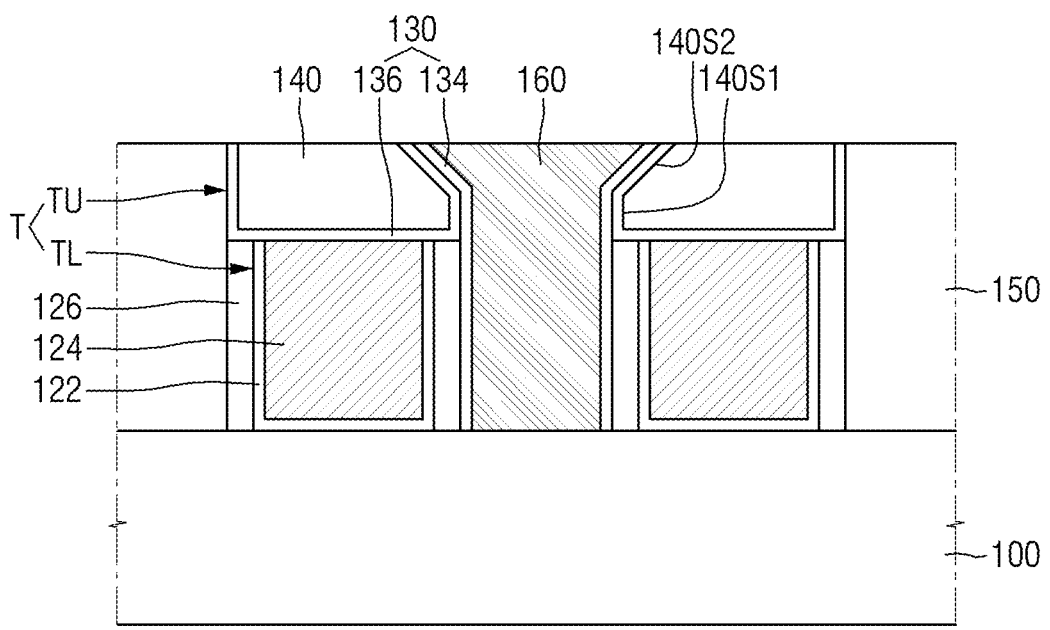
FIG. 6 is a cross-sectional view of a semiconductor device according to some exemplary embodiments of the present disclosure.

FIG. 6 is a cross-sectional view of a semiconductor device according to some exemplary embodiments of the present disclosure. For convenience, descriptions of elements or features that are the same as their respective counterparts of any of FIGS. 1 through 4 will be omitted or at least simplified.

Referring to FIG. 6, an etching stop layer 130 extends further than the etching stop layer 130 of FIG. 1 along second sidewall portions 140S2 of capping patterns 140 and along sidewalls of gate spacers 126. For example, the etching stop layer 130 may include second and third films 134 and 136.

Accordingly, the etching stop layer 130 may extend along the sidewalls of a contact 160 and along the top surfaces of gate electrodes 124.

In some exemplary embodiments, a part of the second film 134 may overlap with a part of the third film 136. As illustrated in FIG. 6, parts of the third and second films 136 and 134 may be sequentially stacked on first sidewall portions 140S1 and the second sidewall portions 140S2 of the capping patterns 140.

Figure 7:
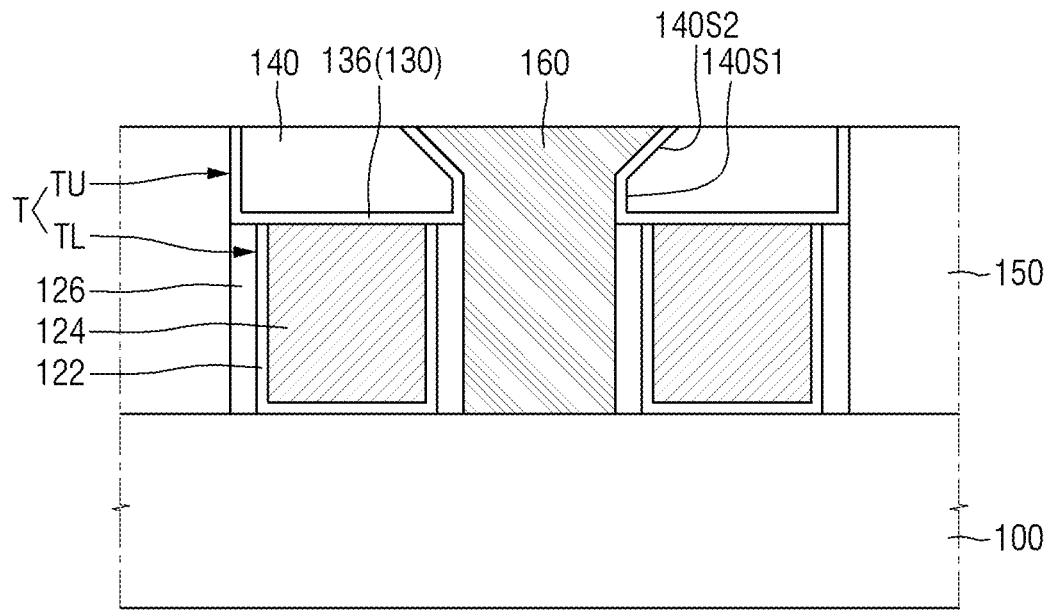
FIG. 7 is a cross-sectional view of a semiconductor device according to some exemplary embodiments of the present disclosure.

FIG. 7 is a cross-sectional view of a semiconductor device according to some exemplary embodiments of the present disclosure. For convenience, descriptions of elements or features that are the same as their respective counterparts of any of FIGS. 1 through 4 will be omitted or at least simplified.

Referring to FIG. 7, an etching stop layer 130, unlike the etching stop layer 130 of FIG. 3, does not include two films stacked on each other, such as shown in FIG. 3. Rather, the etching stop layer 130 may only include a single film, such as third film 136.

Accordingly, the etching stop layer 130 may extend along the top surfaces of gate electrodes 124.

In some exemplary embodiments, since no first film 132 is formed, and only one film rather than two or more stacked films is used, the third film 136 may contact first sidewall portions 140S1 and second sidewall portions 140S2 of capping patterns 140. As discussed in the above embodiments, in some cases, only a single film or layer is used to form etching stop layer 130 or portions of etching stop layer. Therefore, in those embodiments, the portion of etching stop layer 130 that includes only a single film may have a uniform thickness throughout. Similarly, for portions that include two films stacked on each other, those portions may also have a uniform thickness throughout.

Terms such as "uniform," "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 8:
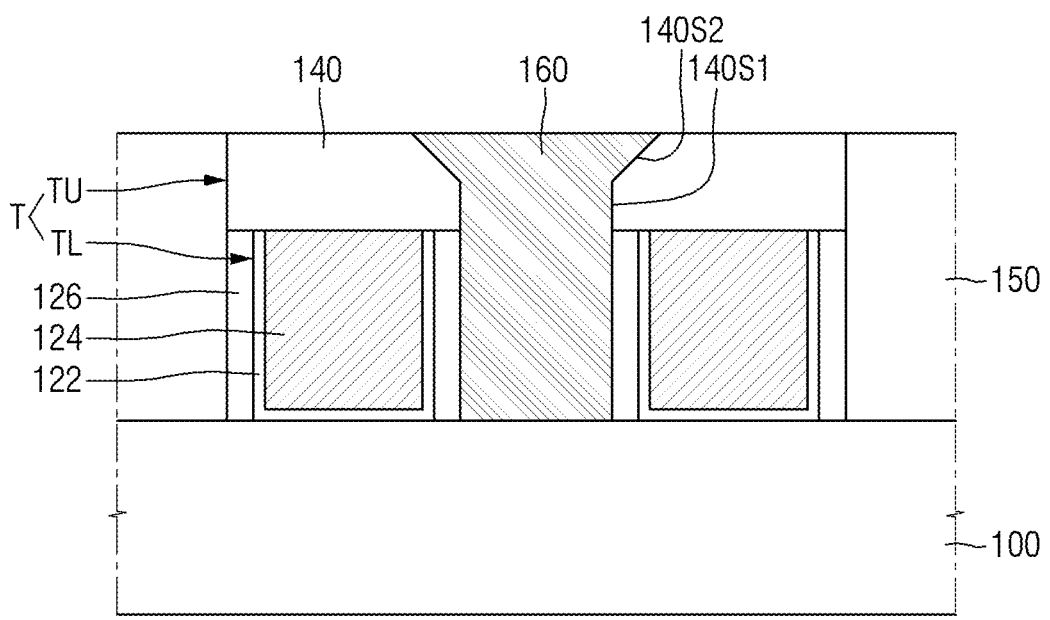
FIG. 8 is a cross-sectional view of a semiconductor device according to some exemplary embodiments of the present disclosure.

FIG. 8 is a cross-sectional view of a semiconductor device according to some exemplary embodiments of the present disclosure. For convenience, descriptions of elements or features that are the same as their respective counterparts of FIG. 1 will be omitted or at least simplified.

Referring to FIG. 8, the semiconductor device according to some exemplary embodiments of the present disclosure, unlike the semiconductor device of FIG. 1, does not include an etching stop layer 130.

Accordingly, sidewalls of contact 160 contact sidewalls of gate spacers 126 and first sidewall portions 140S1 and second sidewall portions 140S2 of capping patterns 140.

Figure 9:
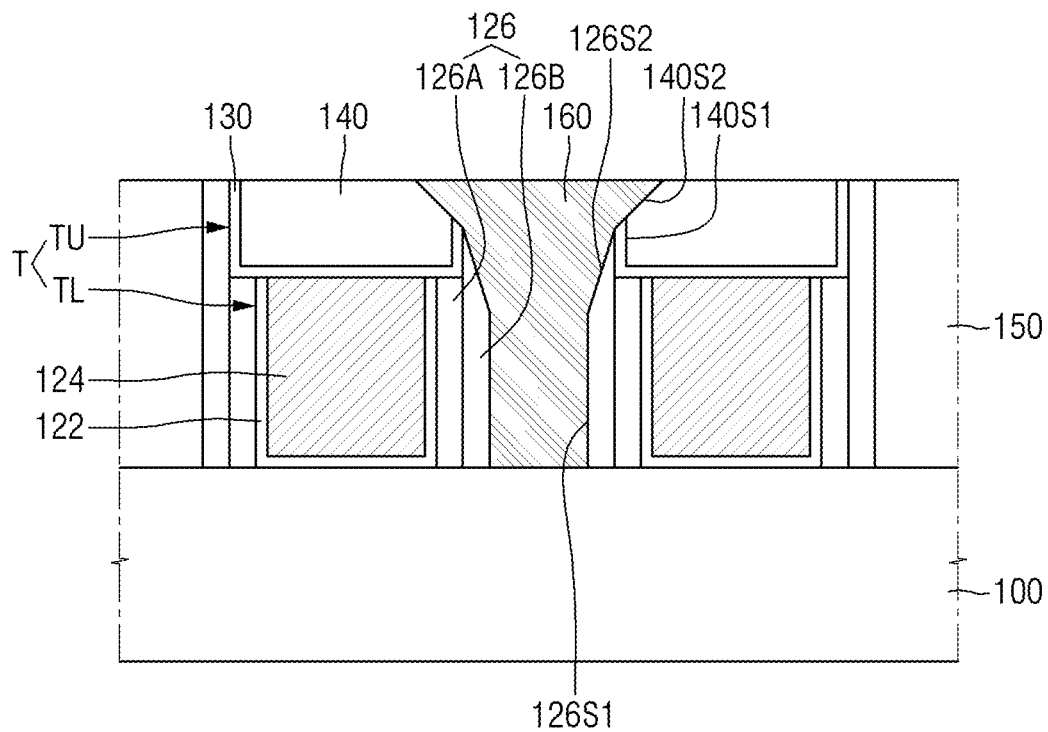
FIG. 9 is a cross-sectional view of a semiconductor device according to some exemplary embodiments of the present disclosure.

FIG. 9 is a cross-sectional view of a semiconductor device according to some exemplary embodiments of the present disclosure. For convenience, descriptions of elements or features that are the same as their respective counterparts of FIG. 1 will be omitted or at least simplified.

Referring to FIG. 9, gate spacers 126 may be formed as multilayer films. For example, the gate spacers 126 may include first spacers 126A and second spacers 126B, which are formed on the first spacers 126A.

The first spacers 126A may be formed on sidewalls of gate electrodes 124 (e.g., with gate insulating film 122 therebetween). The top surfaces of the first spacers 126A may be lower than the top surface of a first interlayer insulating film 150. For example, the top surfaces of the first spacers 126A may be disposed on substantially the same plane as the top surfaces of the gate electrodes 124. Accordingly, the first spacers 126A may define lower portions TL of trenches T.

The first spacers 126A may include, for example, silicon oxide or a low-k material having a lower permittivity than silicon oxide. Accordingly, the first spacers 126A can reduce parasitic capacitance between the gate electrodes 124 and a contact 160.

The second spacers 126B may be formed along sidewalls of the first interlayer insulating film 150 on a substrate 100. For example, the second spacers 126B may be interposed between the first interlayer insulating film 150 and the first spacers 126A. The second spacers 126B may also be interposed between the contact 160 and the first spacers 126A. In some exemplary embodiments, the second spacers 126B may protrude beyond the top surfaces of the first spacers 126A.

Sidewalls of the second spacers 126B adjacent to the contact 160 may define the sidewalls of the contact 160. For example, the second spacers 126B may include a material having etching selectivity with respect to the first interlayer insulating film 150. For example, the second spacers 126B may include silicon nitride.

In some exemplary embodiments, sidewalls of the second spacers 126B may have multiple slopes. For example, the sidewalls of the second spacers 126B adjacent to the contact 160 may include third sidewall portions 126S1 and fourth sidewall portions 126S2, which have a smaller slope than the third sidewall portions 126S1. As discussed above, labels such as "first," "second," "third," and "fourth" are used as a naming convention simply to name certain elements, unless the context indicates that such terms carry additional meaning. For example, as illustrated in FIG. 9, the third sidewall portions 126S1 of the second spacers 126B may be substantially perpendicular to the top surface of the substrate 100, and the fourth sidewall portions 126S2 of the second spacers 126B may be inclined with respect to the top surface of the substrate 100. However, the present disclosure is not limited to this. For example, the third sidewall portions 126S1 may also be inclined with respect to the top surface of the substrate 100 (for example to have a greater incline than the fourth sidewall portions 126S2).

In some exemplary embodiments, second sidewall portions 140S2 of capping patterns 140 may have a smaller slope than the fourth sidewall portions 126S2 of the second spacers 126B. This will be described later with reference to FIGS. 29 through 31.

FIG. 9 illustrates second spacers 126B adjacent to the contact 160 as having substantially the same height as first sidewall portions 140S1 of the capping patterns 140, but the present disclosure is not limited thereto. For example, the height of the second spacers 126B adjacent to the contact 160 may be smaller than the height of the first sidewall portions 140S1 of the capping patterns 140.

Figure 10:
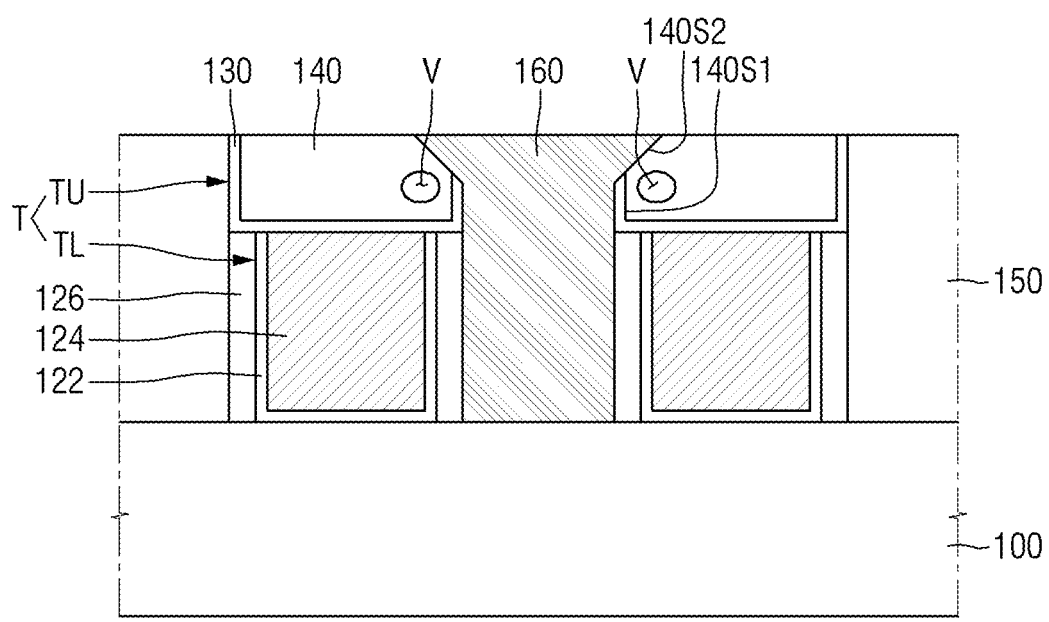
FIG. 10 is a cross-sectional view of a semiconductor device according to some exemplary embodiments of the present disclosure.

FIG. 10 is a cross-sectional view of a semiconductor device according to some exemplary embodiments of the present disclosure. For convenience, descriptions of elements or features that are the same as their respective counterparts of FIG. 1 will be omitted or at least simplified.

Referring to FIG. 10, capping patterns 140 may include voids V.

The voids V may be formed in the capping patterns 140. The voids V may be, for example, air gaps. The voids V may have a lower permittivity than the material of the capping patterns 140. Accordingly, the capping patterns 140 can reduce parasitic capacitance between gate electrodes 124 and a contact 160.

FIG. 10 illustrates the voids V as being adjacent to first sidewall portions 140S1 and second sidewall portions 140S2 of the capping patterns 140, but the present disclosure is not limited thereto. For example, the voids V may be formed at arbitrary locations in the capping patterns 140. Multiple voids V may be formed in each of the capping patterns 140. Though voids are shown only in connection with FIG. 10, similarly placed voids can be included in the various embodiments discussed in connection with FIGS. 1-9. Thus, including a void is not exclusive to FIG. 10. In these examples where a void is present, the capping patterns fill the trenches, and include a void therein.

Figure 11:
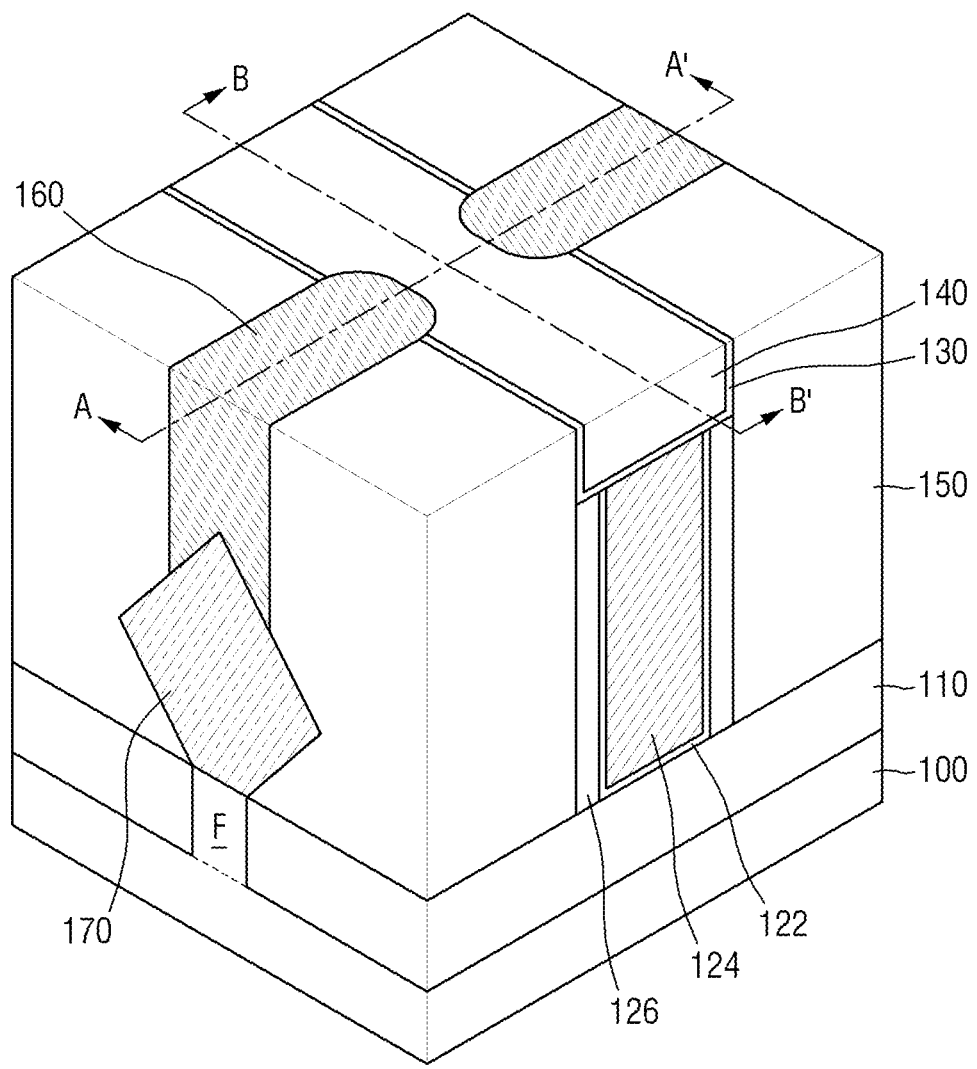
FIG. 11 is a perspective view of a semiconductor device according to some exemplary embodiments of the present disclosure.
Figure 12:
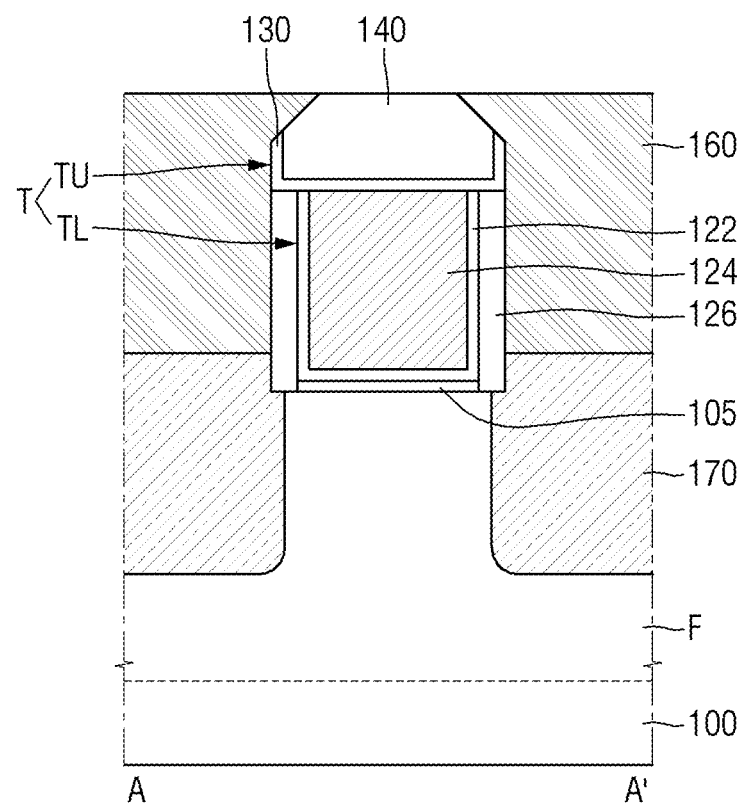
FIG. 12 is a cross-sectional view taken along line A-A' of FIG. 11.
Figure 13:
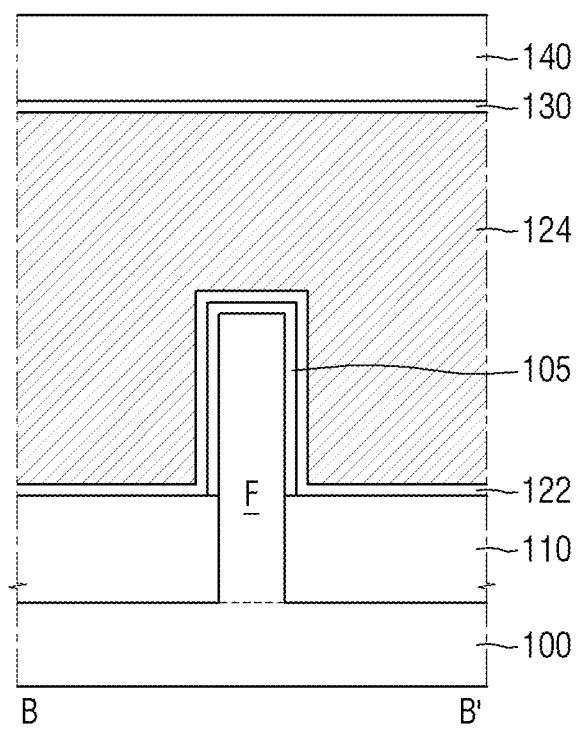
FIG. 13 is a cross-sectional view taken along line B-B' of FIG. 11.

FIG. 11 is a perspective view of a semiconductor device according to some exemplary embodiments of the present disclosure. FIG. 12 is a cross-sectional view taken along line A-A' of FIG. 11. FIG. 13 is a cross-sectional view taken along line B-B' of FIG. 11. For convenience, descriptions of elements or features that are the same as their respective counterparts of FIG. 1 will be omitted or at least simplified.

Referring to FIGS. 11 through 13, the semiconductor device according to some exemplary embodiments of the present disclosure includes a substrate 100, a field insulating film 110, an interface film 105, a gate insulating film 122, a gate electrode 124, gate spacers 126, epitaxial patterns 170, an etching stop layer 130, a capping pattern 140, a first interlayer insulating film 150, and contacts 160.

The substrate 100 may include a fin-type pattern F. The fin-type pattern F may protrude and extend from the top of the substrate 100. The fin-type pattern F may be a part of the substrate 100 and may include an epitaxial layer grown from the substrate 100.

The fin-type pattern F may intersect the gate electrode 124. For example, the fin-type pattern F may extend in a first direction, and the gate electrode 124 may extend in a second direction that crosses the first direction (e.g., in a perpendicular direction).

The fin-type pattern F may include, for example, an element semiconductor material such as silicon or germanium. The fin-type pattern F may also include a compound semiconductor such as, for example, a group IV-IV compound semiconductor or a group III-V compound semiconductor.

For example, in a case where the fin-type pattern F includes a group IV-IV compound semiconductor, the fin-type pattern F may include a binary or ternary compound including at least two of carbon (C), silicon (Si), germanium (Ge), and tin (Sn), or a compound obtained by doping the binary or ternary compound with a group IV element. For example, in a case where the fin-type pattern F includes a group III-V compound semiconductor, the fin-type pattern F may include a binary, ternary, or quaternary compound obtained by combining at least one of aluminum (Al), gallium (Ga), and indium (In) and one of phosphorus (P), arsenic (As), and antimony (Sb). It is assumed that the fin-type pattern F may be a silicon fin-type pattern including silicon.

The channel region of a transistor including the gate electrode 124 may include the fin-type pattern F, but the present disclosure is not limited thereto. Alternatively, the channel region of the transistor including the gate electrode 124 may include a nanowire pattern, a nanosheet pattern, or the like.

The field insulating film 110 may be formed on the substrate 100. The field insulating film 110 may surround parts of the sidewalls of the fin-type pattern F. For example, the fin-type pattern F may be defined by the field insulating film 110. FIG. 11 illustrates the sidewalls of the fin-type pattern F as being generally surrounded by the field insulating film 110, but the present disclosure is not limited thereto.

The field insulating film 110 may include at least one of, for example, an oxide film, a nitride film, an oxynitride film, and a combination thereof, but the present disclosure is not limited thereto.

The interface film 105 may be interposed between the substrate 100 and the gate insulating film 122. The interface film 105 may be formed on the exterior of the fin-type pattern F. For example, the interface film 105 may extend along the profile of the bottom surface of a lower portion TL of a trench T, but the present disclosure is not limited thereto. In another example, the interface film 105 may extend along the profile of the bottom surface and the sidewalls of the lower portion TL of the trench T. In some exemplary embodiments, the interface film 105 may not be provided.

The interface film 105 may include, for example, silicon oxide. The interface film 105 may also include other materials depending on the type of the substrate 100, the type of the fin-type pattern F, or the type of the gate insulating film 122.

The epitaxial patterns 170 may be formed in the fin-type pattern F on both sides of the gate electrode 124. However, the epitaxial patterns 170 may be insulated from the gate electrode 124. The epitaxial patterns 170 may serve as a source and a drain of a transistor.

In some exemplary embodiments, the epitaxial patterns 170 may be an elevated source and an elevated drain. For example, the uppermost parts of the epitaxial patterns 170 may protrude beyond the top surface of the fin-type pattern F. In some exemplary embodiments, the epitaxial patterns 170 may be a shared source and a shared drain that are shared between multiple gate electrodes.

The epitaxial patterns 170 are illustrated as being single-layer films, but the present disclosure is not limited thereto. For example, the epitaxial patterns 170 may be formed as multilayer films.

FIG. 11 illustrates the epitaxial patterns 170 as having a pentagonal cross-sectional shape, but the present disclosure is not limited thereto. Alternatively, the epitaxial patterns 170 may have various cross-sectional shapes such as a diamond or hexagonal cross-sectional shape.

In a case where the semiconductor device according to some exemplary embodiments of the present disclosure is a P-type metal oxide semiconductor (PMOS) transistor, the epitaxial patterns 170 may include P-type impurities or impurities for preventing the diffusion of P-type impurities. For example, the epitaxial patterns 170 may include at least one of B, C, In, Ga, Al, and a combination thereof.

Also, in the case where the semiconductor device according to some exemplary embodiments of the present disclosure is a PMOS transistor, the epitaxial patterns 170 may include a compressive stress material. For example, in a case where the fin-type pattern F is formed of silicon, the epitaxial patterns 170 may include a material having a larger lattice constant than silicon, such as, for example, silicon germanium. The compressive stress material may apply compressive stress to the fin-type pattern F and may thus improve the mobility of carriers in a channel region.

On the other hand, in a case where the semiconductor device according to some exemplary embodiments of the present disclosure is an N-type metal oxide semiconductor (NMOS) transistor, the epitaxial patterns 170 may include N-type impurities or impurities for preventing the diffusion of N-type impurities. For example, the epitaxial patterns 170 may include at least one of P, Sb, As, and a combination thereof.

Also, in the case where the semiconductor device according to some exemplary embodiments of the present disclosure is an NMOS transistor, the epitaxial patterns 170 may include a tensile stress material. For example, in a case where the fin-type pattern F is formed of silicon, the epitaxial patterns 170 may include a material having a smaller lattice constant than silicon, such as, for example, SiC. The tensile stress material may apply tensile stress to the fin-type pattern F and may thus improve the mobility of carriers in a channel region.

The etching stop layer 130 may extend along parts of the sidewalls of the capping pattern 140 and along the bottom surface of the capping pattern 140. For example, the etching stop layer 130 may extend along parts of sidewalls of the contacts 160, along the top surface of the gate electrode 124, along the top surface of the gate insulating film 122, along the top surfaces of the gate spacers 126, and along sidewalls of the first interlayer insulating film 150. Also, the etching stop layer 130 may be formed on first sidewall portions 140S1 of the capping pattern 140. However, in one embodiment, the etching stop layer 130 is not formed on second sidewall portions 140S2 of the capping pattern 140.

The capping pattern 140 may cover the top surface of the gate electrode 124 and the top surfaces of the gate spacers 126. The capping pattern 140 may fill part or all of a trench T defined by the top surface of the gate electrode 124, the top surfaces of the gate spacers 126, the sidewalls of the first interlayer insulating film 150, and sidewalls of the contacts 160.

In some exemplary embodiments, the capping pattern 140 may be formed on the etching stop layer 130. The capping pattern 140 may be formed in an upper portion TU of the trench T.

The contacts 160 may be formed on the epitaxial patterns 170. The contacts 160 may be electrically connected to the epitaxial patterns 170. Accordingly, the contacts 160 may apply a voltage to the epitaxial patterns 170.

As illustrated in FIGS. 11 and 12, the contacts 160 may be formed on both sides of the gate electrode 124. For example, the contacts 160 may penetrate a part of the first interlayer insulating film 150 on both sides of the gate electrode 124.

Figure 14:
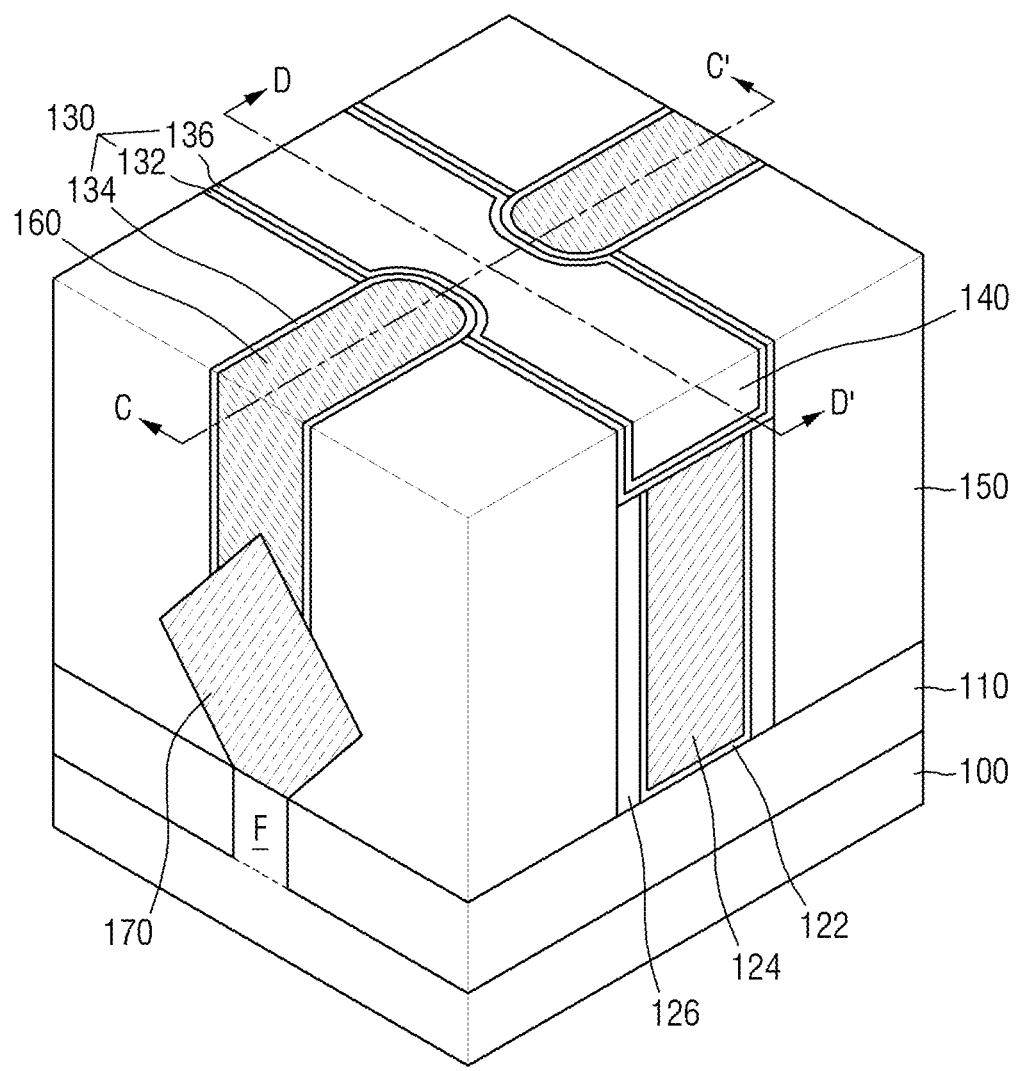
FIG. 14 is a perspective view of a semiconductor device according to some exemplary embodiments of the present disclosure.
Figure 15:
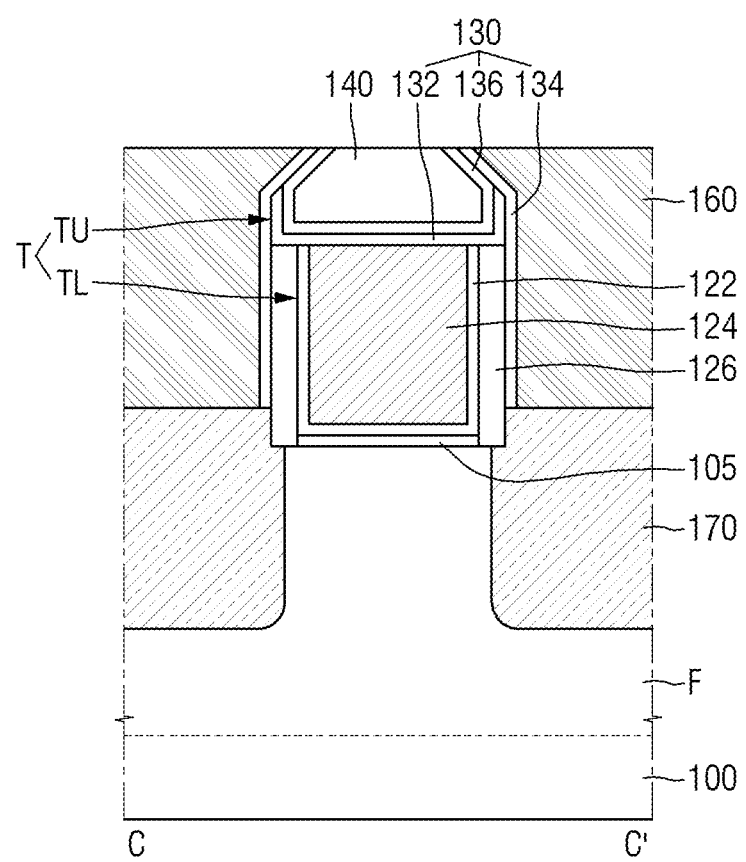
FIG. 15 is a cross-sectional view taken along line C-C' of FIG. 14.
Figure 16:
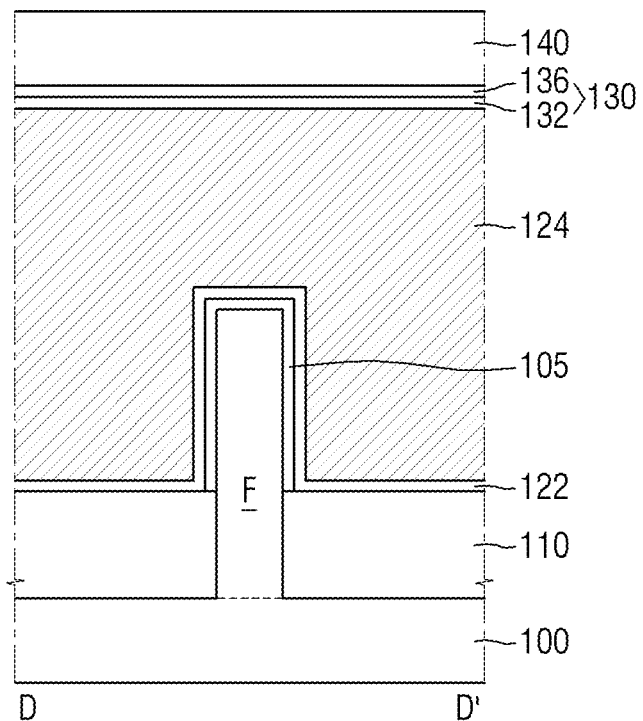
FIG. 16 is a cross-sectional view taken along line D-D' of FIG. 14.

FIG. 14 is a perspective view of a semiconductor device according to some exemplary embodiments of the present disclosure. FIG. 15 is a cross-sectional view taken along line C-C' of FIG. 14. FIG. 16 is a cross-sectional view taken along line D-D' of FIG. 14. For convenience, descriptions of elements or features that are the same as their respective counterparts of any of FIGS. 1 through 4 will be omitted or at least simplified.

Referring to FIGS. 14 through 16, an etching stop layer 130 extends further than the etching stop layer 130 of FIGS. 11 through 13 along second sidewall portions 140S2 of capping patterns 140 and along sidewalls of gate spacers 126. For example, the etching stop layer 130 may include first, second, and third films 132, 134, and 136.

Accordingly, the etching stop layer 130 may extend along sidewalls of contacts 160 and along the top surface of a gate electrode 124.

In some exemplary embodiments, a part of the first film 132 may be interposed between the second and third films 134 and 136. Since the first film 132 is not formed on the second sidewall portions 140S2 of the capping pattern 140, the second and third films 134 and 136 may contact each other. As illustrated in FIGS. 14 through 16, parts of the second and third films 134 and 136 may be sequentially stacked on the second sidewall portions 140S2 of the capping pattern 140.

In some exemplary embodiments, a part of the second film 134 may overlap with parts of the first and third films 132 and 136. As illustrated in FIGS. 14 through 16, parts of the third, first, and second films 136, 132, and 134 may be sequentially stacked on first sidewall portions 140S1 of the capping pattern 140.

Methods of fabricating a semiconductor device according to some exemplary embodiments of the present disclosure will hereinafter be described with reference to FIGS. 1 through 3, 9, 11, and 17 through 44.

FIGS. 17 through 28B are cross-sectional views illustrating intermediate steps of a method of fabricating a semiconductor device according to some exemplary embodiments of the present disclosure. For convenience, descriptions of elements or features that are the same as their respective counterparts of any of FIGS. 1 through 3 will be omitted or at least simplified.

Figure 17:
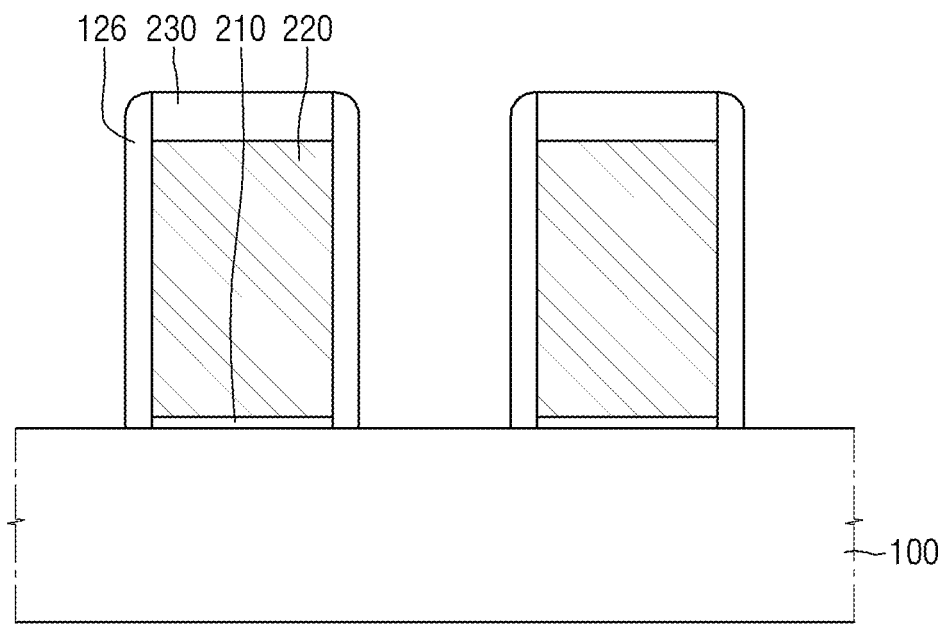
FIGS. 17 through 28B are cross-sectional views illustrating intermediate steps of a method of fabricating a semiconductor device according to some exemplary embodiments of the present disclosure.

Referring to FIG. 17, a dummy gate insulating film 210 and dummy gate electrodes 220 are formed on a substrate 100.

For example, an insulating film and a conductive film may be sequentially formed on the substrate 100 and may then be patterned using first mask patterns 230. As a result, the dummy gate insulating film 210 and the dummy gate electrodes 220 may be formed on the substrate 100.

Thereafter, gate spacers 126 are formed on sidewalls of the dummy gate insulating film 210 and on the sidewalls of each of the dummy gate electrodes 220.

For example, a spacer film may be formed on the profiles of the substrate 100, the dummy gate insulating film 210, the dummy gate electrodes 220, and the first mask patterns 230. Thereafter, the spacer film may be removed from the top surface of the substrate 100 and from the top surfaces of the first mask patterns 230. As a result, the gate spacers 126 may be formed on sidewalls of the dummy gate insulating film 210 and on the sidewalls of each of the dummy gate electrodes 220.

Figure 18:
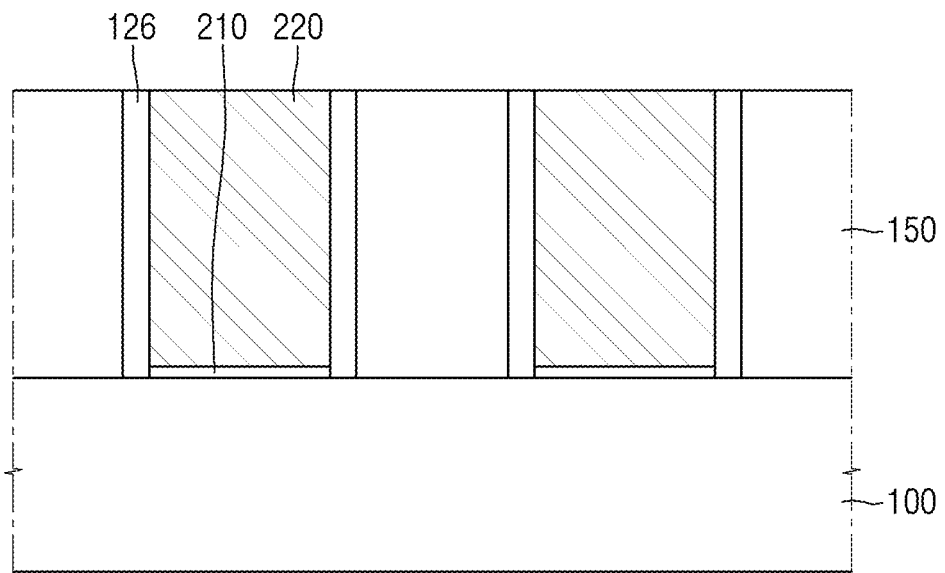

Referring to FIG. 18, a first interlayer insulating film 150 is formed on the substrate 100. The first interlayer insulating film 150 may be formed to surround sidewalls of the gate spacers 126.

For example, the first interlayer insulating film 150 may be formed to cover the dummy gate electrodes 220 and the dummy gate insulating film 210. Thereafter, a planarization process may be continued until the top surfaces of the dummy gate electrodes 220 are exposed. The planarization process may include, for example, a chemical mechanical polishing (CMP) process. In some exemplary embodiments, the first mask patterns 230 may be removed by the planarization process.

Accordingly, the top surface of the first interlayer insulating film 150, the top surfaces of the gate spacers 126, and the top surfaces of the dummy gate electrodes 220 may be disposed on substantially the same plane.

Figure 19:
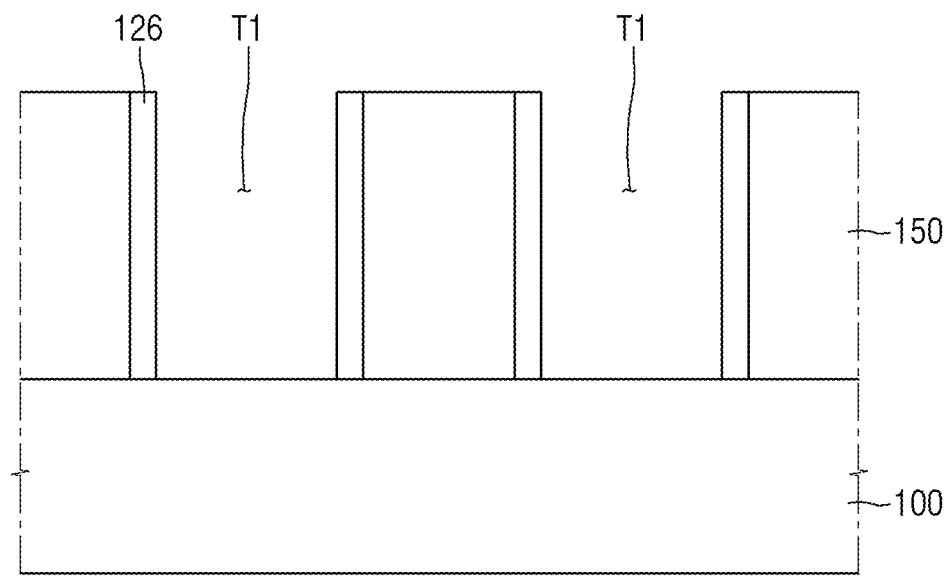

Referring to FIG. 19, the dummy gate insulating film 210 and the dummy gate electrodes 220 are removed.

As a result, first trenches T1 are formed in the first interlayer insulating film 150. The first trenches T1 may be defined by sidewalls of the gate spacers 126 and the top surface of the substrate 100.

Figure 20:
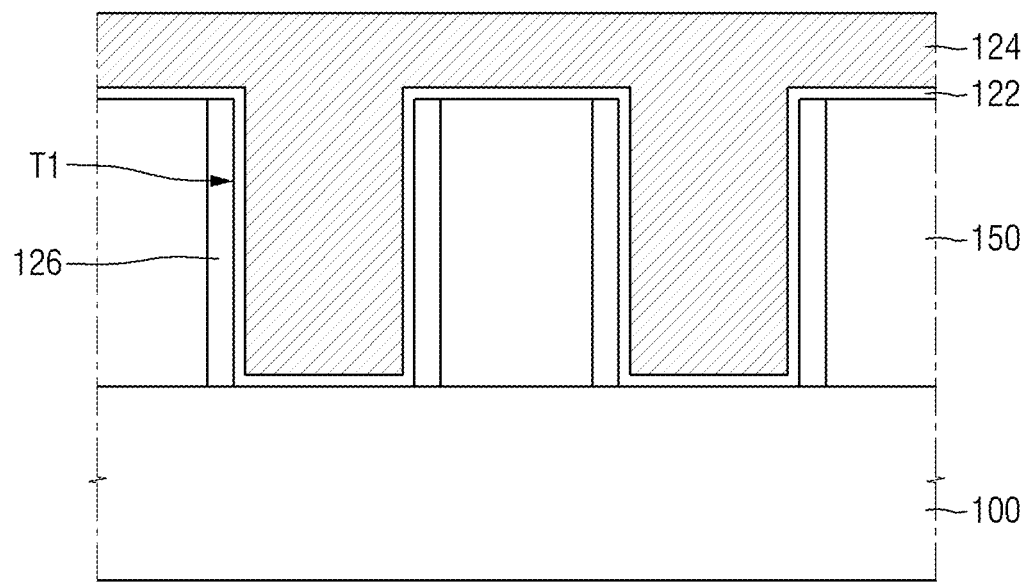

Referring to FIG. 20, a gate insulating film 122 and a gate electrode 124 are sequentially formed in the first trenches T1.

For example, the gate insulating film 122 may be formed to extend along the profiles of the top surface of the first interlayer insulating film 150, the top surfaces of the gate spacers 126, sidewalls of the gate spacers 126, and the top surface of the substrate 100.

Thereafter, the gate electrode 124 may be formed on the gate insulating film 122. The gate electrode 124 may fill spaces formed by the gate insulating film 122 in the first trenches T1.

Figure 21:
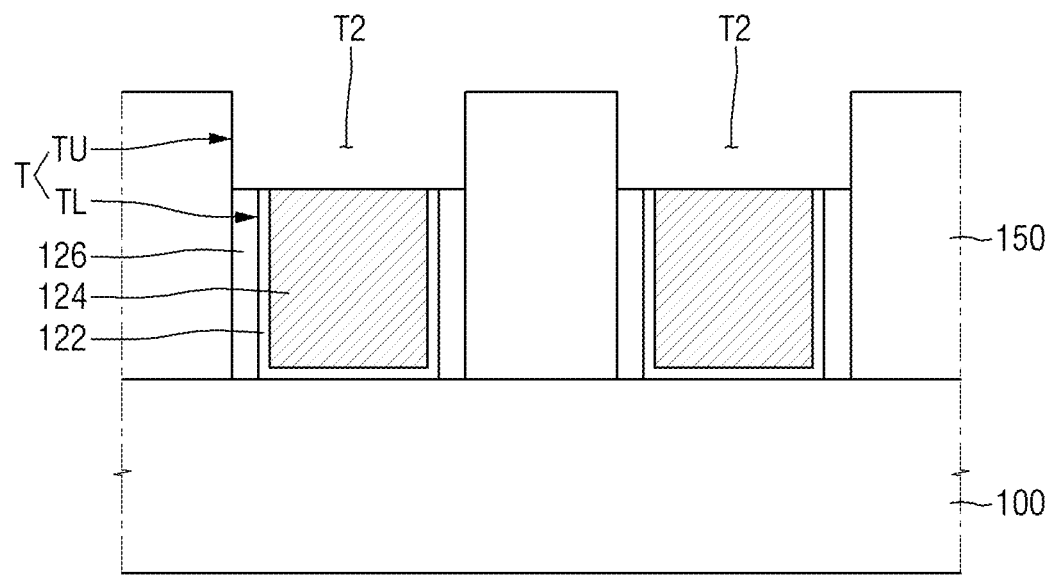

Referring to FIG. 21, upper parts of the gate insulating film 122 and the gate electrode 124 are recessed.

The recessing of the upper parts of the gate insulating film 122 and the gate electrode 124 may be continued until the top surfaces of the gate insulating film 122 and the gate electrode 124 become lower than the top surface of the first interlayer insulating film 150.

As a result, second trenches T2 may be formed in the first interlayer insulating film 150. The second trenches T2 may be defined by the top surfaces of gate electrodes 124, the top surface of the gate insulating film 122, the top surfaces of the gate spacers 126, and sidewalls of the first interlayer insulating film 150.

As a result, trenches T including lower portions TL and upper portions TU may be defined in the first interlayer insulating film 150. The gate insulating film 122 and the gate electrodes 124 may fill the lower portions TL of the trenches T.

Figure 22:
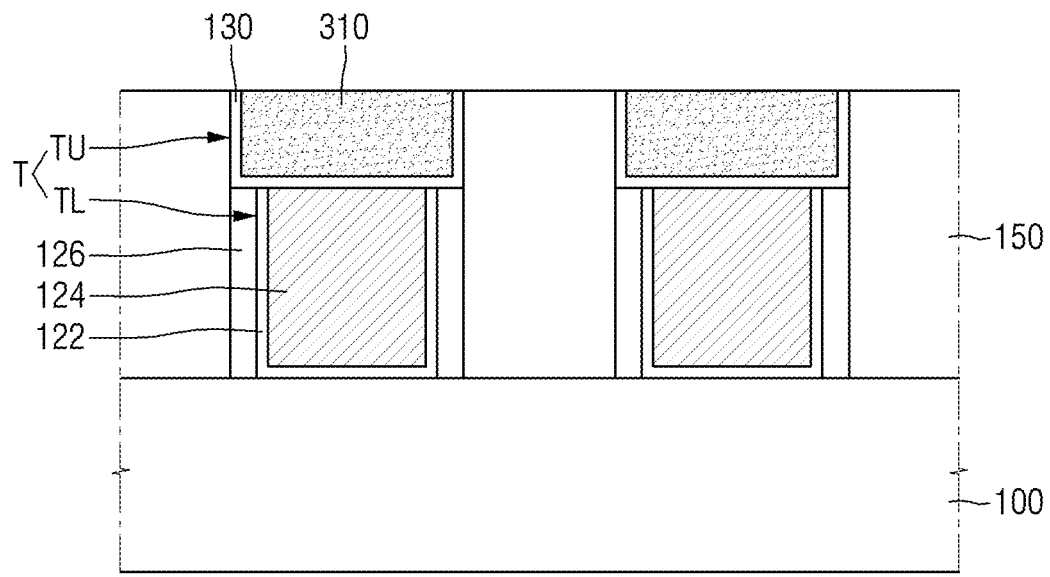

Referring to FIG. 22, an etching stop layer 130 and second mask patterns 310 are formed on the gate electrodes 124.

For example, the etching stop layer 130 and the second mask patterns 310 are sequentially formed on the structure shown in FIG. 21. Thereafter, a planarization process may be continued until the top surface of the first interlayer insulating film 150 is exposed.

As a result, the etching stop layer 130 may be formed to extend along the profiles of the upper portions TU of the trenches T. The etching stop layer 130 may extend along the top surfaces of the gate electrodes 124, the top surface of the gate insulating film 122, the top surfaces of the gate spacers 126, and the sidewalls of the first interlayer insulating film 150.

The etching stop layer 130 may include at least one of, for example, aluminum nitride, aluminum oxide, silicon oxide, silicon nitride, and a combination thereof.

The second mask patterns 310 may be formed on the etching stop layer 130. The second mask patterns 310 may fill parts of the upper portions TU of the trenches T that are not filled by the etching stop layer 130.

In some exemplary embodiments, the second mask patterns 310 may include a semiconductor material. For example, the second mask patterns 310 may include a semiconductor material such as silicon or silicon germanium. In some exemplary embodiments, the second mask patterns 310 may include amorphous silicon or polysilicon.

In some exemplary embodiments, the etching stop layer 130 is not formed.

Figure 23:
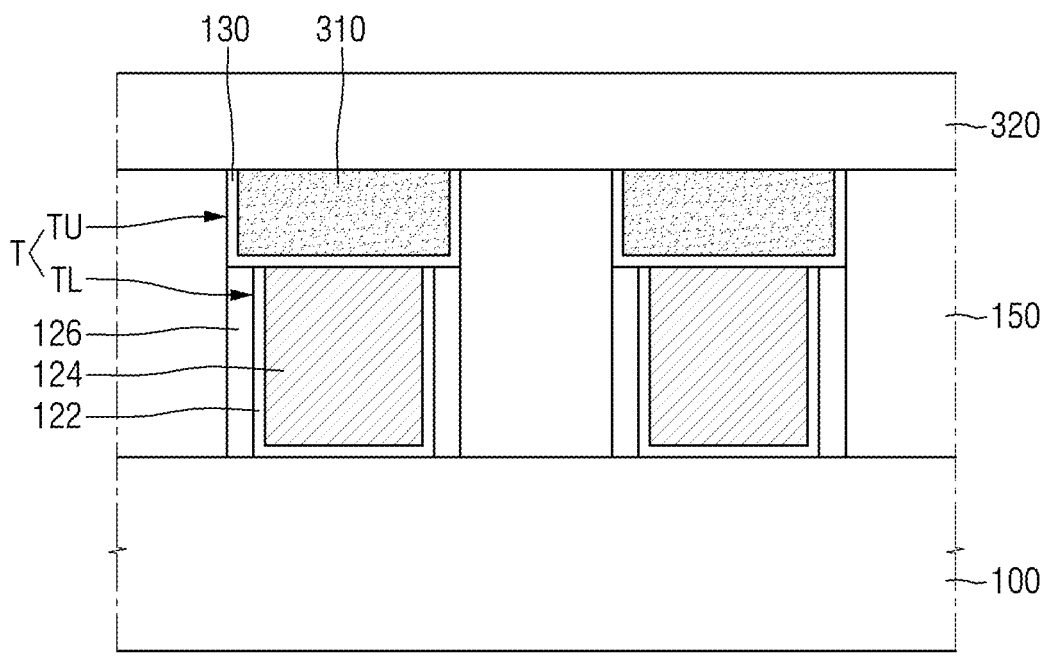

Referring to FIG. 23, a second interlayer insulating film 320 is formed on the structure shown in FIG. 22.

Accordingly, the second interlayer insulating film 320 may be formed to cover the top surface of the first interlayer insulating film 150, the top surface of the etching stop layer 130, and the top surfaces of the second mask patterns 310.

The second interlayer insulating film 320 may include at least one of, for example, silicon oxide, silicon nitride, silicon oxynitride, and a low-k material having a lower permittivity than silicon oxide. In some exemplary embodiments, the second interlayer insulating film 320 may include substantially the same material as the first interlayer insulating film 150.

Figure 24:
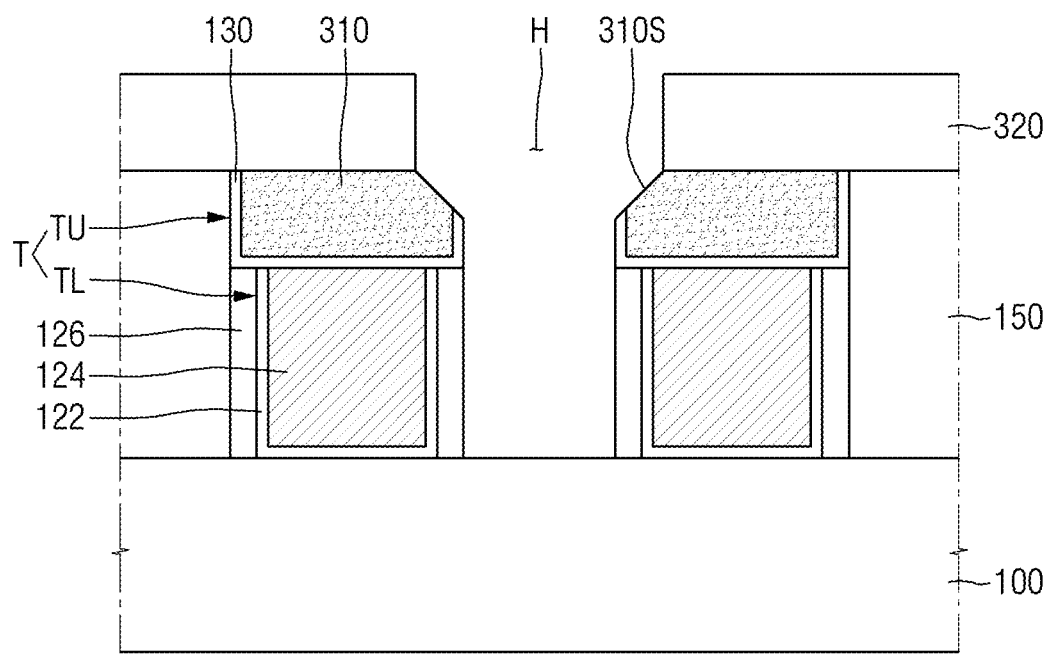

Referring to FIG. 24, a contact hole H is formed to penetrate the first and second interlayer insulating films 150 and 320.

The contact hole H may be formed on sidewalls of the gate electrodes 124 and on sidewalls of the second mask patterns 310. The contact hole H may be formed to expose the top surface of the substrate 100.

The contact hole H may be formed by an SAC process. For example, the sidewalls of the contact hole H may be defined by sidewalls of the second interlayer insulating film 320, sidewalls of the second mask patterns 310, and sidewalls of the gate spacers 126. Where an etching stop layer 130 is used, the contact hole H may be further defined by a portion of the etching stop layer 130. As the contact hole H is formed, sidewalls of the capping patterns 140 may include first inclined surfaces 310S. The first inclined surfaces 310S of the capping patterns 140 may be inclined with respect to the top surface of the substrate 100.

The second mask patterns 310, which include a semiconductor material such as silicon or silicon germanium, may have a greater etching resistance than silicon oxide or silicon nitride. For example, the second mask patterns 310 may have a lower etching selectivity than silicon oxide or silicon nitride with respect to the first and second interlayer insulating films 150 and 320. Accordingly, the first inclined surfaces 310S of the second mask patterns 310 can have a gentle slope, and a sufficiently large distance can be secured between the gate electrodes 124 and the contact hole H.

Figure 25A:
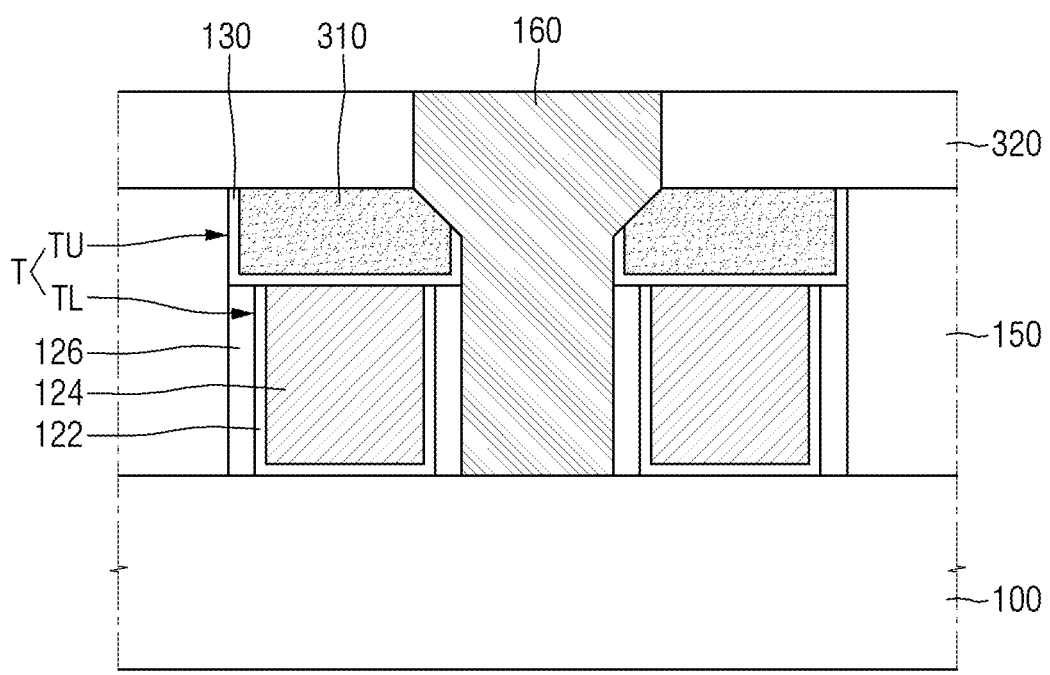

Referring to FIG. 25A, a contact 160 is formed to fill the contact hole H. The contact 160 discussed here and in the other embodiments may be formed, for example, of a conductive material, such as a metal, or silicon doped with impurities. The contact 160 may be formed, for example, by filling the hole H with a conductive material. The contact 160 discussed in the various embodiments may be referred to herein as a conductive contact, a via contact, a plug, or a contact plug. The contact 160 may have a circular or other bilaterally symmetric shape from a top-down view, or may have an elongated shape, such as a line shape.

Accordingly, the sidewalls of the contact 160 may be defined by the sidewalls of the second interlayer insulating film 320, sidewalls of the second mask patterns 310, and sidewalls of the gate spacers 126. Where an etching stop layer 130 is used, sidewalls of the contact 160 may be further defined by a portion of the etching stop layer 130. Sidewalls described as being defined by certain components may be shaped based on those components, and/or may be located in a particular position based on those components.

Figure 25B:
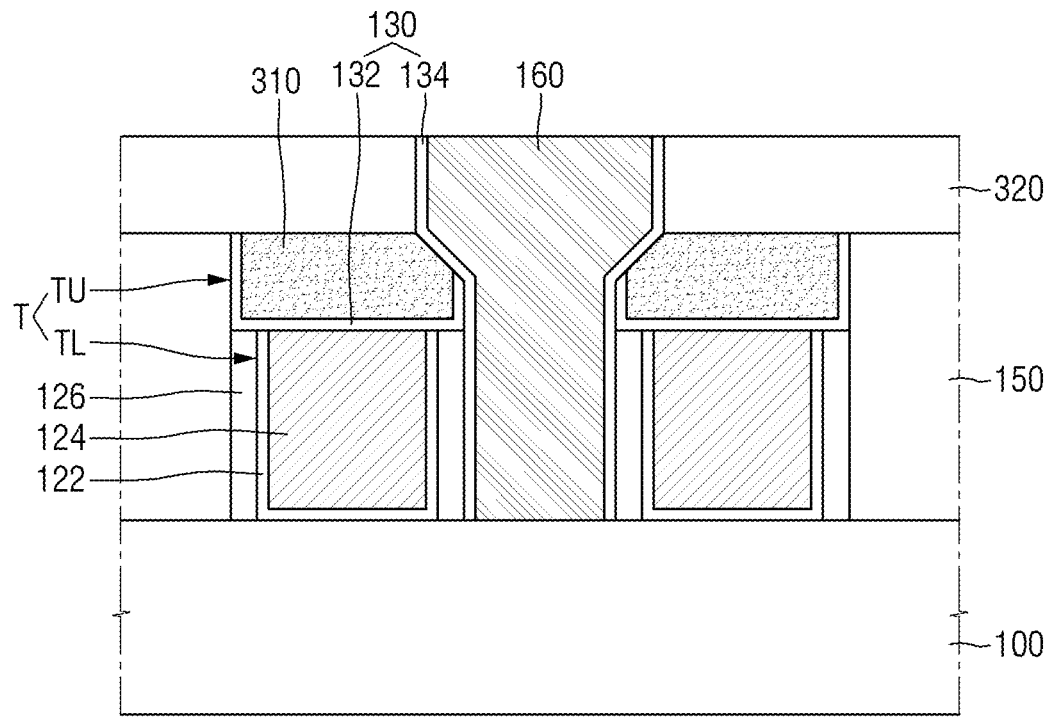

Referring to FIG. 25B, in some exemplary embodiments, before the formation of the contact 160, the etching stop layer 130 may be further formed to extend along the sidewalls of the contact hole H.

For example, as illustrated in FIG. 25B, the etching stop layer 130 may include first and second films 132 and 134.

The second film 134 may be formed on the structure shown in FIG. 24. Thereafter, the contact 160 may be formed to fill a space in the contact hole H that is not filled by the second film 134. The second film 134 may protect the contact 160 from an etching process for removing the second mask patterns 310.

In some exemplary embodiments, the second film 134 may be selectively removed from the top surface of the substrate 100. In some exemplary embodiments, the second film 134 may be removed from the first inclined surfaces 310S. For example, during the selective removal of the second film 134 from the top surface of the substrate 100, the second film 134 may also be removed from the first inclined surfaces 310S.

Figure 26:
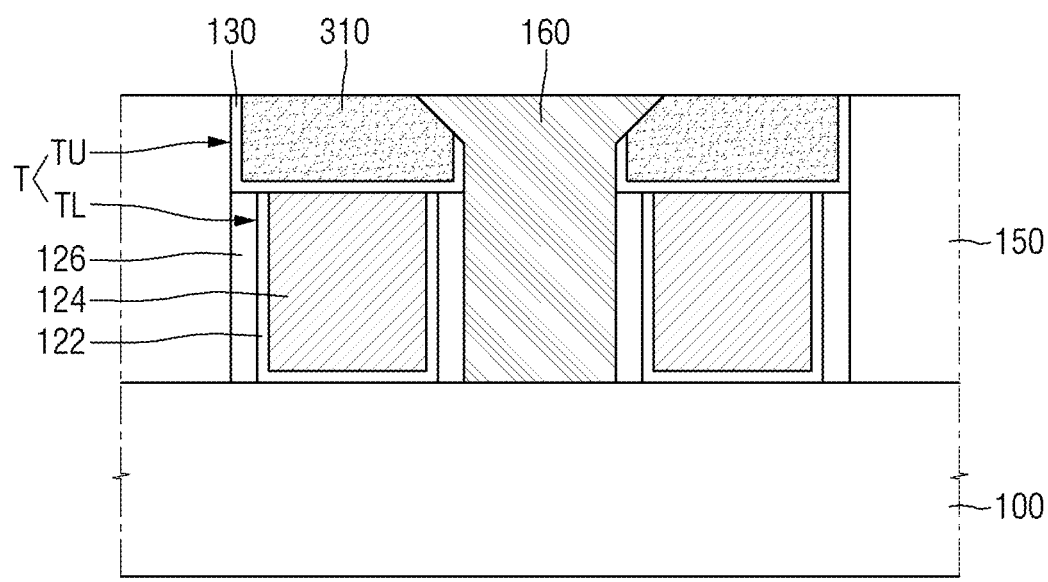

Referring to FIG. 26, a planarization process is performed. FIG. 26 is a cross-sectional view for explaining a process performed on the structure shown in FIG. 25A.

As a result of the planarization process, the second interlayer insulating film 320 may be removed. The planarization process may be continued until the top surfaces of the second mask patterns 310 are exposed.

Figure 27:
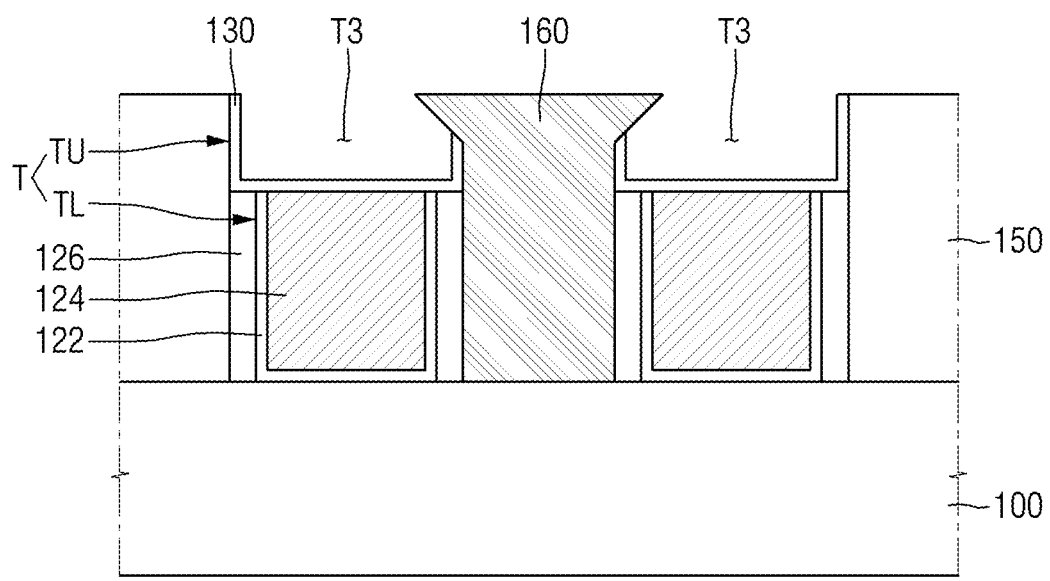

Referring to FIG. 27, the second mask patterns 310 are removed. As a result, third trenches T3 are formed in the first interlayer insulating film 150.

For example, the second mask patterns 310 may be removed using an etching process including a wet or dry etching process.

In some exemplary embodiments, the etching stop layer 130 may protect the gate electrodes 124 or the contact 160. For example, the etching stop layer 130, which extends along parts of the sidewalls of the contact 160 or the top surfaces of the gate electrodes 124, may protect the gate electrodes 124 or the contact 160 from the etching process for removing the second mask patterns 310.

Figure 28A:
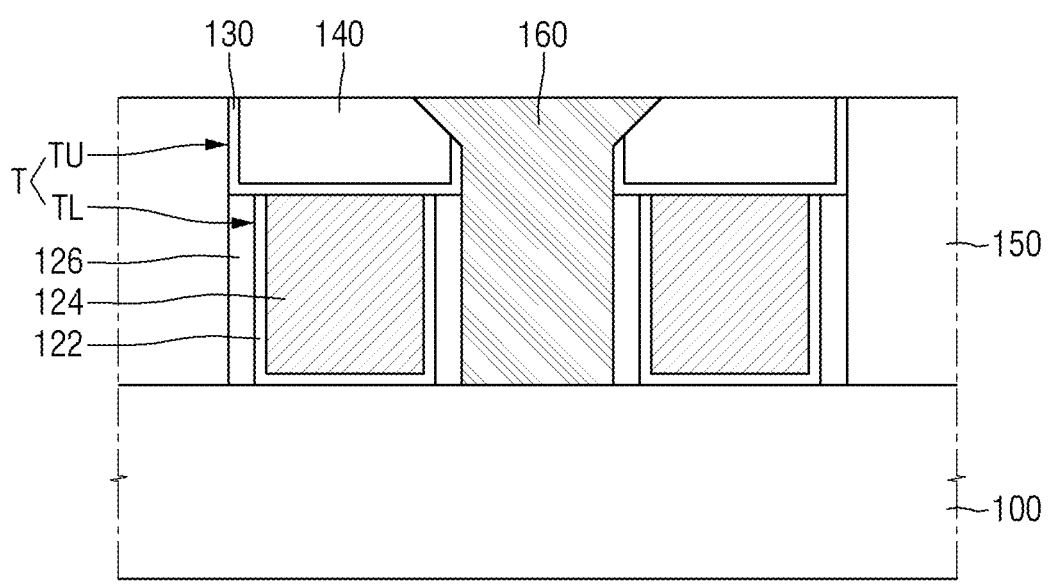

Referring to FIG. 28A, capping patterns 140 are formed in the third trenches T3.

Accordingly, the etching stop layer 130 and the capping patterns 140 may be formed to fill the upper portions TU of the trenches T.

The capping patterns 140 may include, for example, a low-k material. Accordingly, the capping patterns 140 can efficiently reduce parasitic capacitance or a leakage current between the gate electrodes 124 and the contact 160. For example, the capping patterns 140 may include silicon oxide or a low-k material having a lower permittivity than silicon oxide. In some exemplary embodiments, the capping patterns 140 may include substantially the same material as the first interlayer insulating film 150.

Figure 28B:
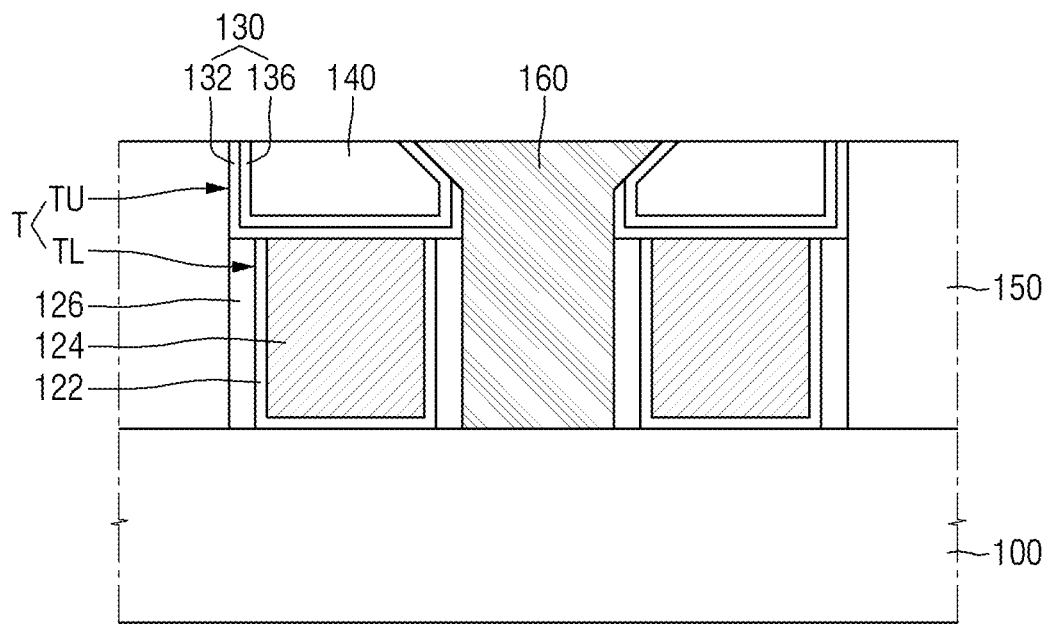

Referring to FIG. 28B, before the formation of the capping patterns 140, the etching stop layer 130 may be further formed in the third trenches T3.

For example, as illustrated in FIG. 28B, the etching stop layer 130 may include first and third films 132 and 136.

The third film 136 may be formed on the structure shown in FIG. 27. Thereafter, the capping patterns 140 may be formed to fill spaces in the third trenches T3 that are not filled by the third film 136. The third film 136 may protect the gate electrodes 124 or the contact 160.

Figure 29:
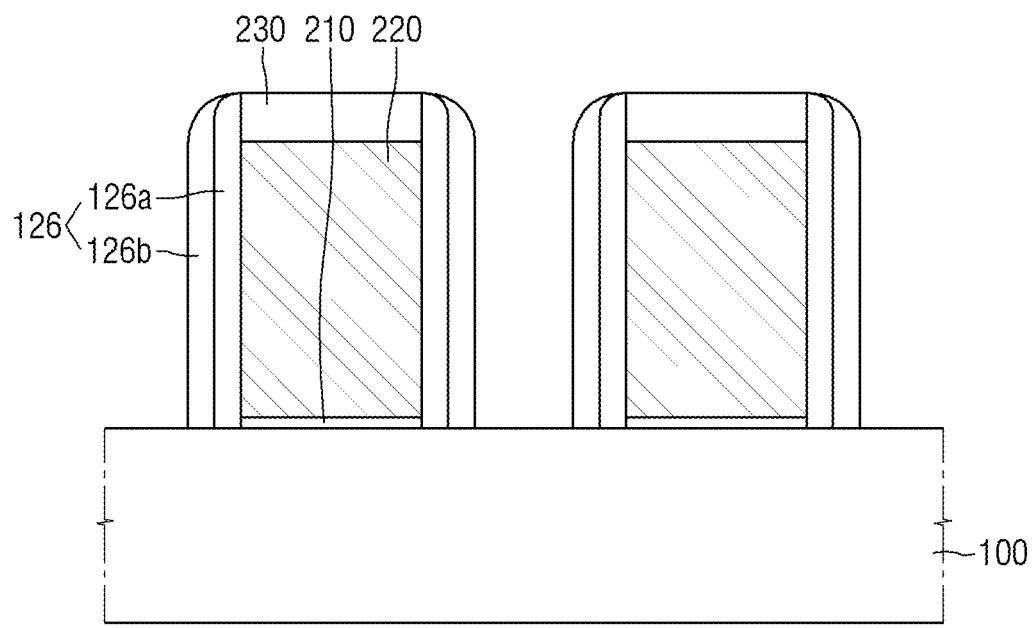
FIGS. 29 through 31 are cross-sectional views illustrating intermediate steps of a method of fabricating a semiconductor device according to some exemplary embodiments of the present disclosure.
Figure 30:
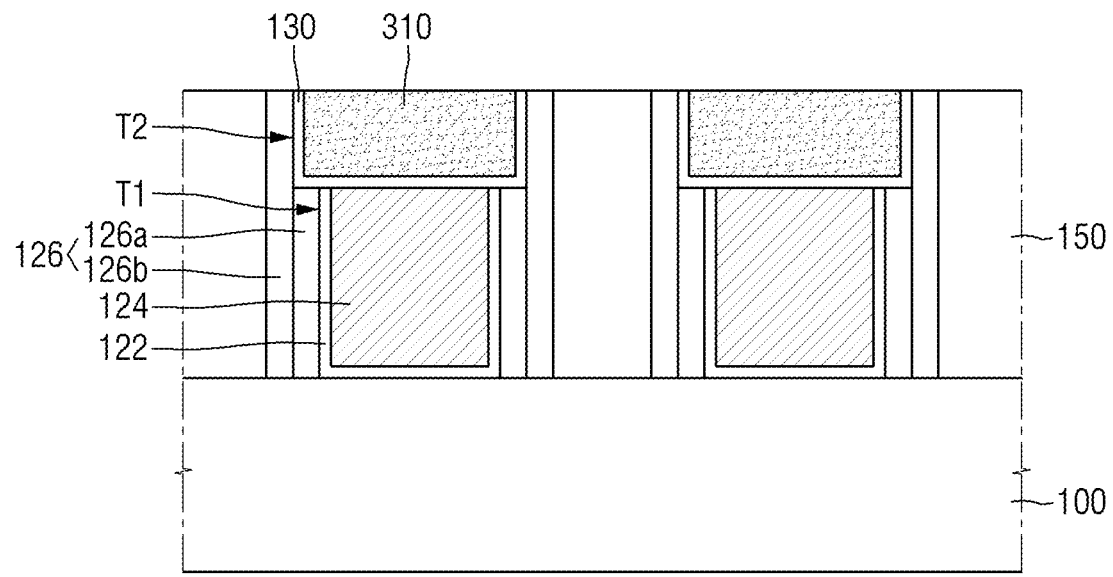
Figure 31:
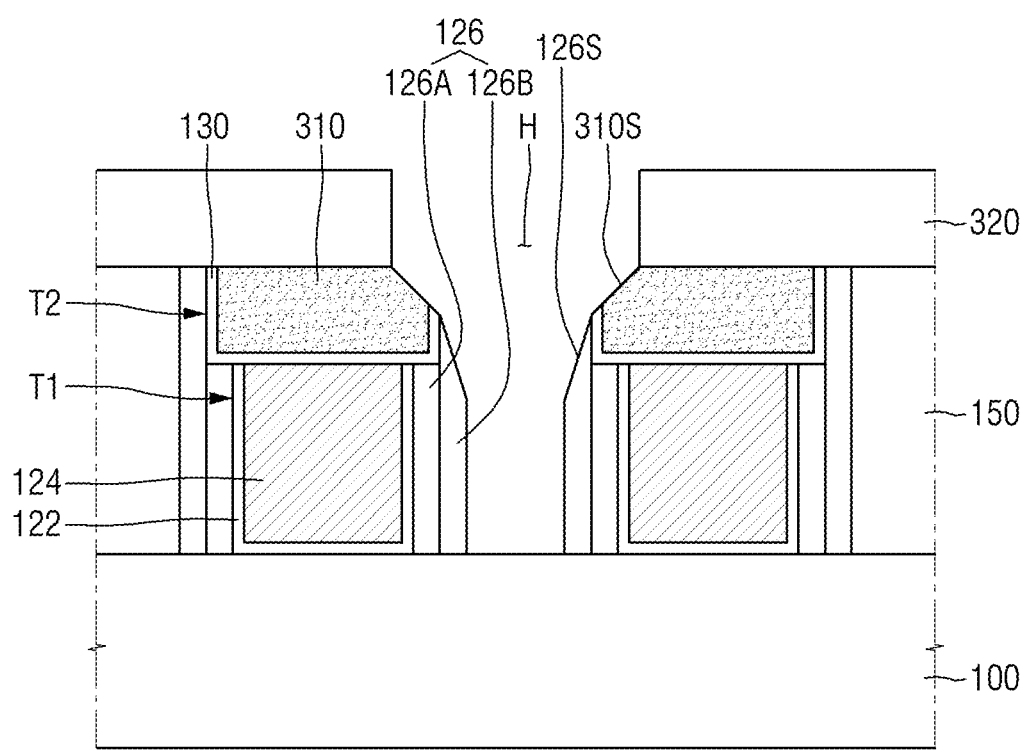

FIGS. 29 through 31 are cross-sectional views illustrating intermediate steps of a method of fabricating a semiconductor device according to some exemplary embodiments of the present disclosure. For convenience, descriptions of elements or features that are the same as their respective counterparts of any of FIGS. 9 and 17 through 28B will be omitted or at least simplified.

Referring to FIG. 29, a dummy gate insulating film 210 and dummy gate electrodes 220 are formed on a substrate 100. Thereafter, gate spacers 126 including first spacers 126A and second spacers 126B are formed on sidewalls of the dummy gate insulating film 210 and sidewalls of the dummy gate electrodes 220.

The first spacers 126A may be formed on sidewalls of the dummy gate electrodes 220. The first spacers 126A may include, for example, silicon oxide or a low-k material having a lower permittivity than silicon oxide.

The second spacers 126B may be formed on sidewalls of the first spacers 126A. The second spacers 126B may include, for example, silicon nitride.

Referring to FIG. 30, an etching stop layer 130 and second mask patterns 310 are formed.

The formation of the etching stop layer 130 and the second mask patterns 310 is similar to the formation of the etching stop layer 130 and the second mask patterns 310 of FIGS. 18 through 22, and thus, detailed descriptions thereof will be omitted.

In some exemplary embodiments, upper parts of the second spacers 126B may not be recessed during the formation of second trenches T2 (of FIG. 21).

Referring to FIG. 31, a contact hole H is formed to penetrate first and second interlayer insulating films 150 and 320.

The contact hole H may be formed by an SAC process. That is, the sidewalls of the contact hole H may be defined by sidewalls of the second interlayer insulating film 320, sidewalls of the second mask patterns 310, and sidewalls of the second spacers 126B.

As the contact hole H is formed, sidewalls of the second mask patterns 310 may include first inclined surfaces 310S. Sidewalls of the second spacers 126B may include second inclined surfaces 126S.

In some exemplary embodiments, the second mask patterns 310 may include a semiconductor material such as silicon or silicon germanium, and the second spacers 126B may include silicon nitride. Thus, the second mask patterns 310 may have a lower etching selectivity than the second spacers 126B with respect to the first and second interlayer insulating films 150 and 320. Accordingly, in some exemplary embodiments, the first inclined surfaces 310S may have a smaller slope than the second inclined surfaces 126S.

Thereafter, referring to FIG. 9, a contact 160 may be formed in the contact hole H.

FIGS. 32 through 44 are cross-sectional views illustrating intermediate steps of a method of fabricating a semiconductor device according to some exemplary embodiments of the present disclosure. For convenience, descriptions of elements or features that are the same as their respective counterparts of any of FIGS. 11 and 17 through 28B will be omitted or at least simplified.

Figure 32:
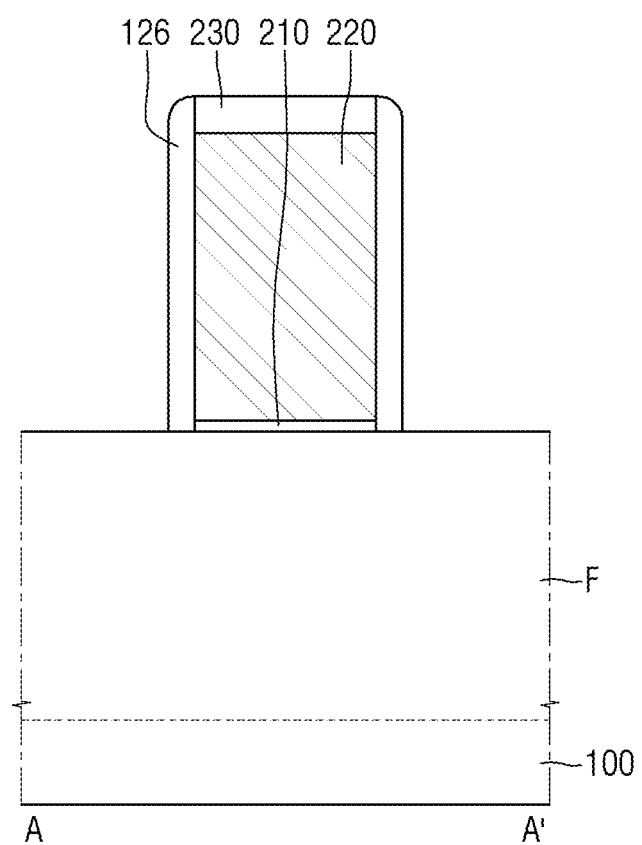
FIGS. 32 through 44 are cross-sectional views illustrating intermediate steps of a method of fabricating a semiconductor device according to some exemplary embodiments of the present disclosure.

Referring to FIG. 32, a dummy gate insulating film 210 and a dummy gate electrode 220 are formed on a substrate 100.

The substrate 100 may include a fin-type pattern F. The fin-type pattern F may protrude and extend from the top of the substrate 100. The fin-type pattern F may be a part of the substrate 100 or may include an epitaxial layer grown from the substrate 100.

The fin-type pattern F may intersect a gate electrode 124. For example, the fin-type pattern F may extend in a first direction, and the gate electrode 124 may extend in a second direction that intersects the first direction.

Figure 33:
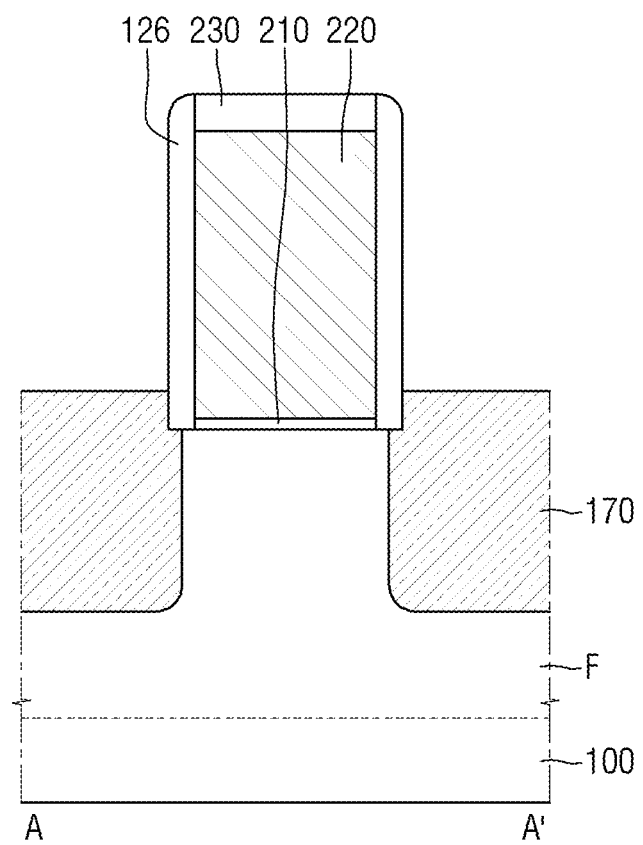

Referring to FIG. 33, epitaxial patterns 170 are formed on the substrate 100.

The epitaxial patterns 170 may be formed on the sidewalls of the gate electrode 124. For example, the epitaxial patterns 170 may include an epitaxial layer formed on the fin-type pattern F. The epitaxial patterns 170 may be elevated source and drain regions whose top surfaces protrude beyond the top surface of the substrate 100.

For example, parts of the fin-type pattern F may be etched using an etching process that uses the gate electrode 124 and the gate spacers 126 as an etching mask. Thereafter, the epitaxial patterns 170 may be formed in the etched parts of the fin-type pattern F using an epitaxial growth method.

Figure 34:
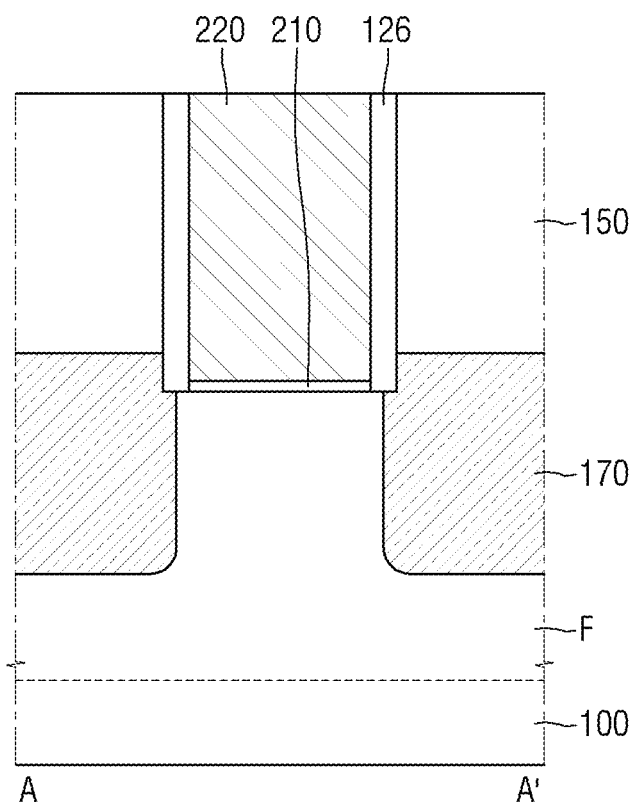

Referring to FIG. 34, a first interlayer insulating film 150 is formed on the substrate 100. The first interlayer insulating film 150 may be formed to surround sidewalls of the gate spacers 126.

Figure 35:
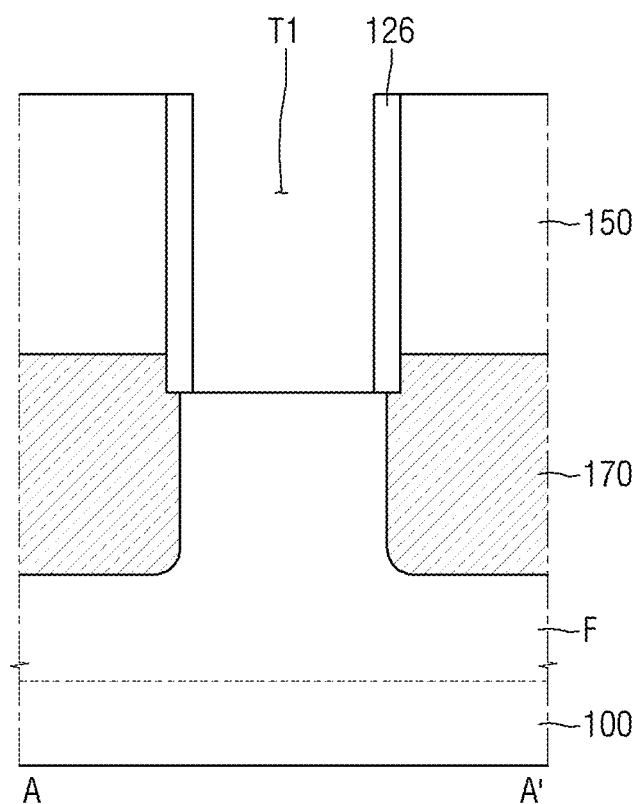

Referring to FIG. 35, the dummy gate insulating film 210 and the dummy gate electrode 220 are removed. As a result, a first trench T1 is formed in the first interlayer insulating film 150.

Figure 36:
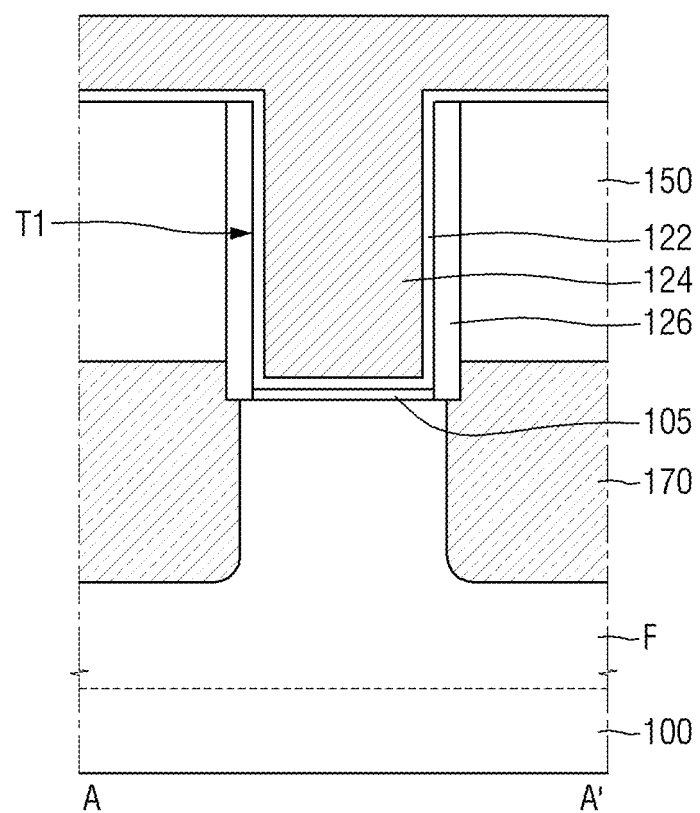

Referring to FIG. 36, a gate insulating film 122 and a gate electrode 124 are sequentially formed in the first trench T1.

Figure 37:
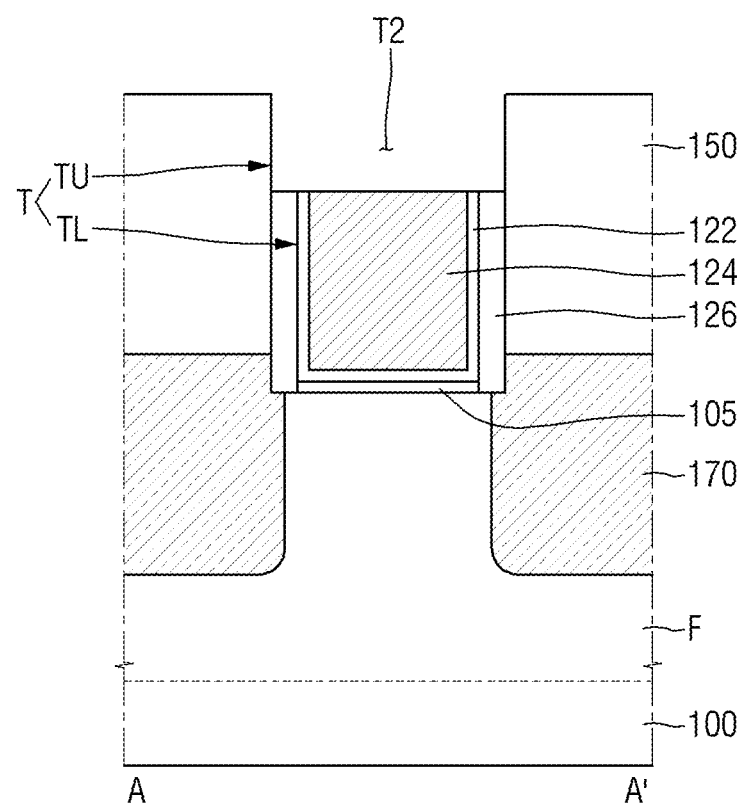

Referring to FIG. 37, upper parts of the gate insulating film 122 and the gate electrode 124 are recessed. As a result, a second trench T2 may be formed in the first interlayer insulating film 150. Also, a trench including a lower portion TL and an upper portion TU may be defined in the first interlayer insulating film 150.

Figure 38:
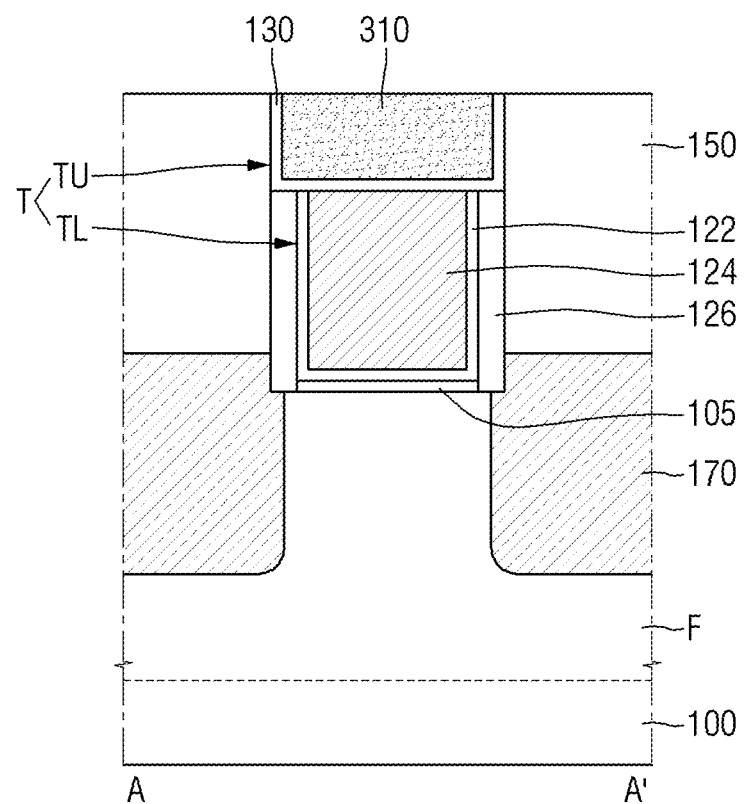

Referring to FIG. 38, an etching stop layer 130 and a second mask pattern 310 are formed on the gate electrode 124.

Figure 39:
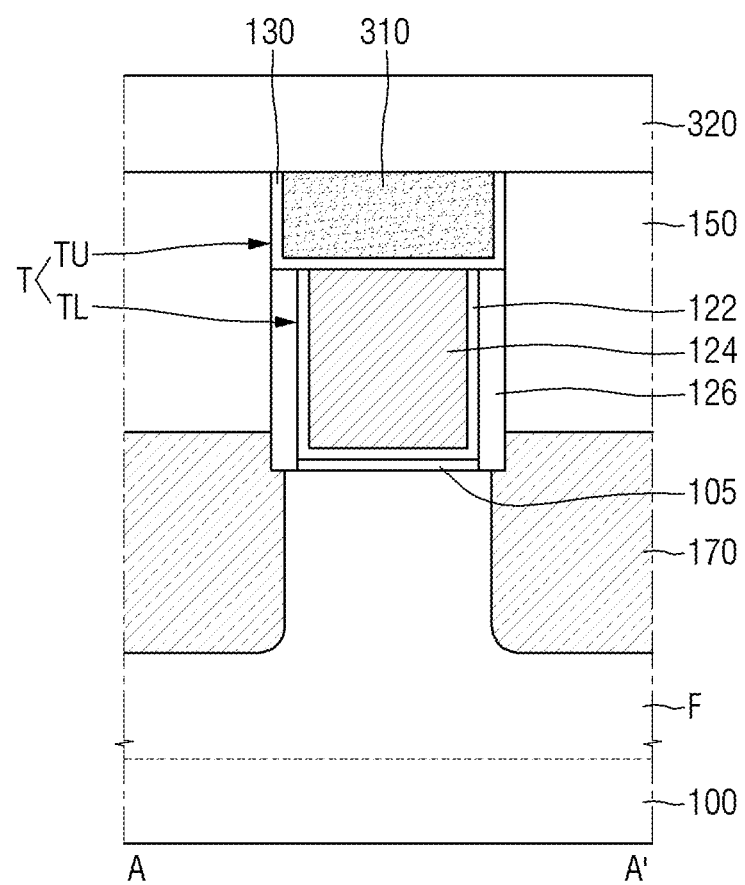

Referring to FIG. 39, a second interlayer insulating film 320 is formed on the structure shown in FIG. 38.

Figure 40:
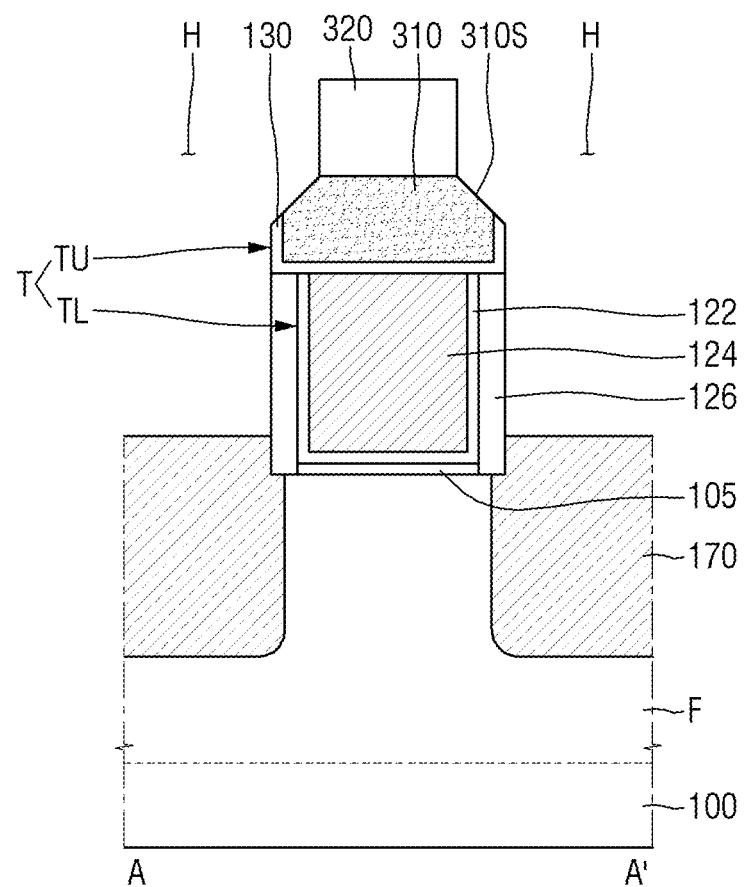

Referring to FIG. 40, contact holes H are formed to penetrate the first and second interlayer insulating films 150 and 320. The contact holes H may be formed on the sidewalls of the gate electrode 124 and on the sidewalls of the second mask pattern 310. The contact holes H may be formed by an SAC process.

Figure 41:
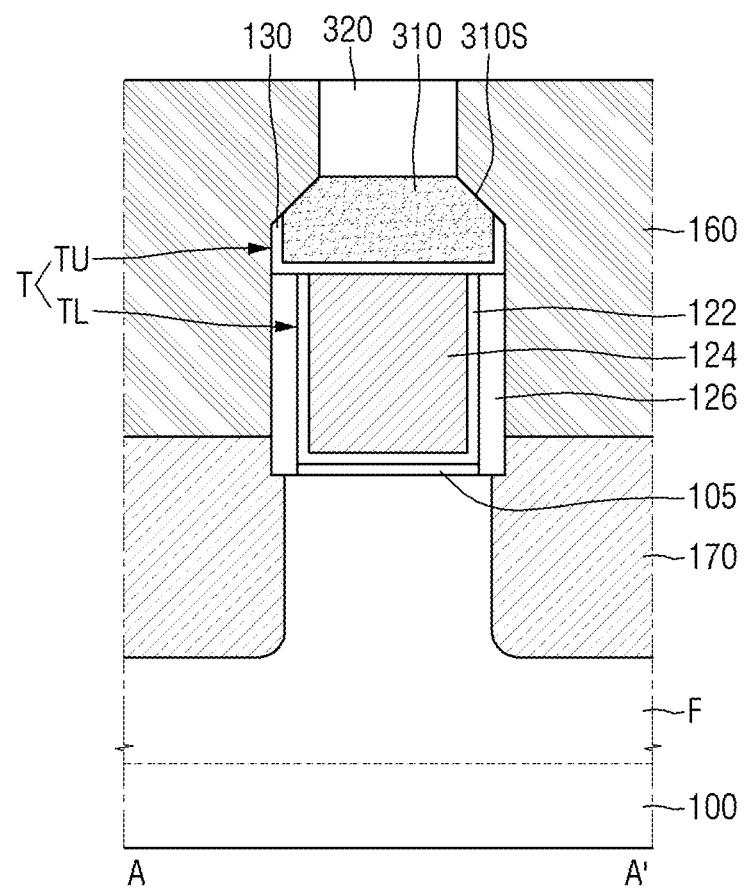

Referring to FIG. 41, contacts 160 are formed to fill the contact holes H. Accordingly, sidewalls of the contacts 160 may be defined by the sidewalls of the second interlayer insulating film 320, the sidewalls of the second mask pattern 310, and sidewalls of the gate spacers 126.

Figure 42:
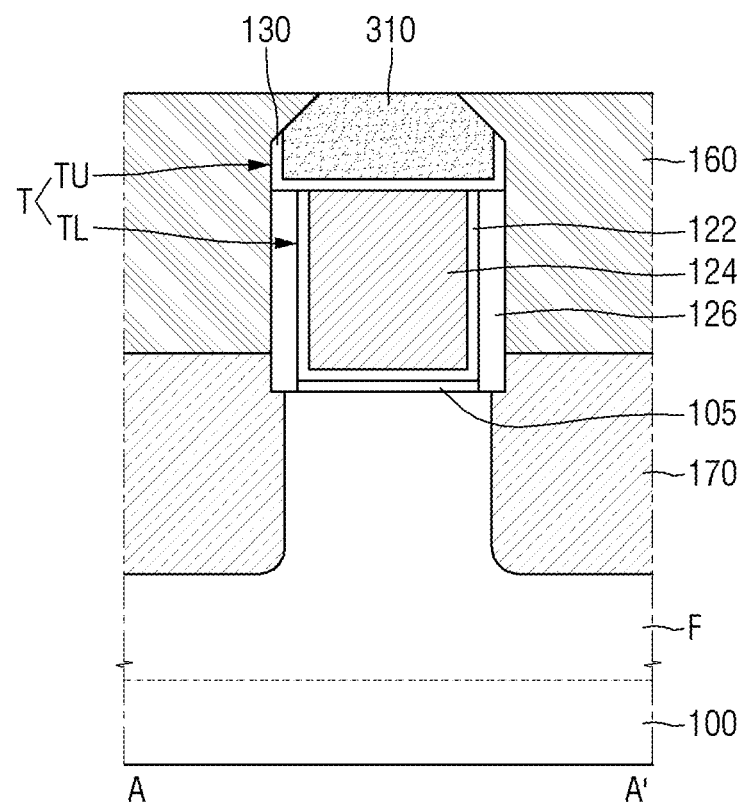

Referring to FIG. 42, a planarization process is performed. The planarization process may be continued until the top surface of the second mask pattern 310 is exposed.

Figure 43:
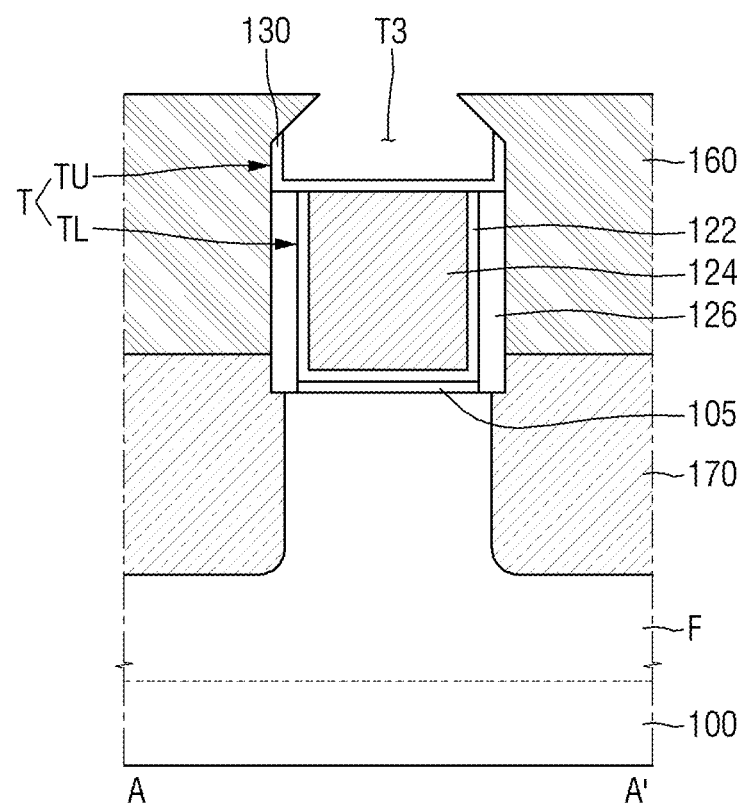

Referring to FIG. 43, the second mask pattern 310 is removed. As a result, a third trench T3 is formed in the first interlayer insulating film 150.

Figure 44:
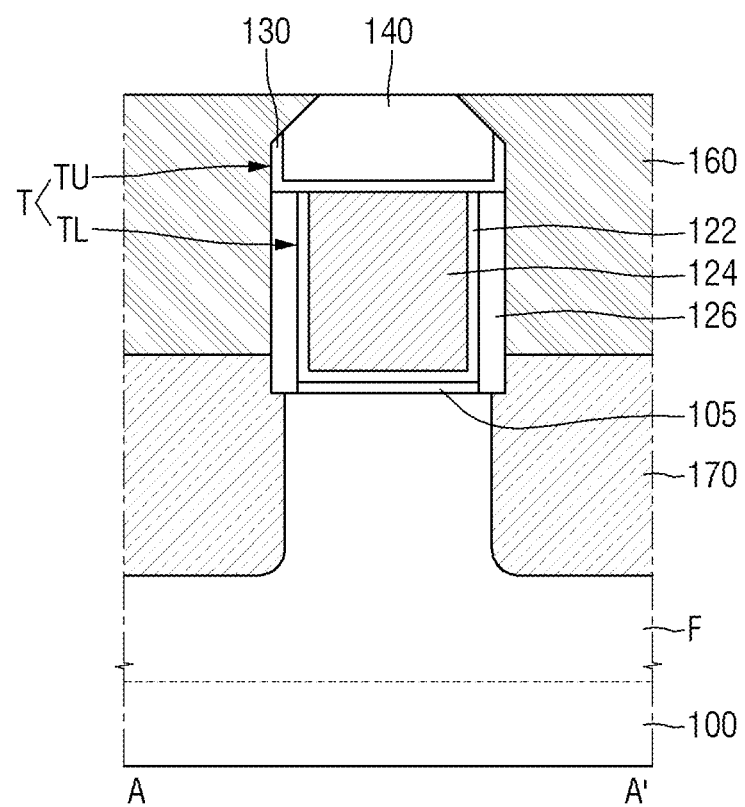

Referring to FIG. 44, a capping pattern 140 is formed in the third trench T3. Accordingly, the etching stop layer 130 and the capping pattern 140 may be formed to fill the upper portion TU of the trench T.

The semiconductor devices shown in the various figures may be, for example, semiconductor chips, which may in turn be included in a package such as a semiconductor package. The semiconductor chips may be logic chips or memory chips. The semiconductor devices may include one or more of the various structures described in connection with FIGS. 1-16, 28A, 28B, and 44.

While the present inventive concept has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
    a substrate;
    a gate electrode on the substrate;
    a first spacer on a sidewall of the gate electrode;
    a conductive contact on a sidewall of the first spacer to protrude beyond a top surface of the gate electrode;
    a trench defined by the top surface of the gate electrode, a top surface of the first spacer, and sidewalls of the conductive contact;
    an etching stop layer extending along at least parts of sidewalls of the trench and a bottom surface of the trench; and
    a capping pattern on the etching stop layer to fill the trench,
    wherein the capping pattern includes silicon oxide or a low-k material having a lower permittivity than silicon oxide.

2. The semiconductor device of claim 1, wherein a sidewall of the capping pattern adjacent to the conductive contact includes a first sidewall portion and a second sidewall portion, which is formed above the first sidewall portion and has a smaller slope than the first sidewall portion.

3. The semiconductor device of claim 2, wherein the etching stop layer includes a first film, which extends along the first sidewall portion and along the top surface of the gate electrode, and a second film, which extends along the first and second sidewall portions and along the sidewall of the first spacer.

4. The semiconductor device of claim 3, wherein the etching stop layer further includes a third film, which is formed on the first film and extends along a bottom surface and the first and second sidewall portions of the capping pattern.

5. The semiconductor device of claim 2, wherein the etching stop layer includes a first film, which extends along the first sidewall portion and along the top surface of the gate electrode, and a second film, which is formed on the first film and extends along a bottom surface and the first and second sidewall portions of the capping pattern.

6. The semiconductor device of claim 1, wherein the etching stop layer includes at least one of aluminum nitride, aluminum oxide, silicon oxide, silicon nitride, and a combination thereof.

7. The semiconductor device of claim 1, further comprising:
a second spacer between the first spacer and the conductive contact to protrude beyond the top surface of the first spacer,
wherein the conductive contact extends along the sidewall of the capping pattern and along a sidewall of the second spacer.

8. The semiconductor device of claim 7, wherein a sidewall of the capping pattern adjacent to the conductive contact includes a first sidewall portion and a second sidewall portion, which is formed above the first sidewall portion and has a smaller slope than the first sidewall portion,
a sidewall of the second spacer adjacent to the conductive contact includes a third sidewall portion and a fourth sidewall portion, which is formed above the third sidewall portion and has a smaller slope than the third sidewall portion, and
the second sidewall portion has a smaller slope than the fourth sidewall portion.

9. The semiconductor device of claim 8, wherein the second spacer includes silicon nitride.

10. A semiconductor device comprising:
a substrate;
an interlayer insulating film formed on the substrate and including a trench, which has lower and upper portions;
a gate electrode filling the lower portion of the trench;
an etching stop layer extending along at least a first sidewall of the upper portion of the trench and along a top surface of the gate electrode;
a capping pattern formed on the etching stop layer and filling the upper portion of the trench; and
a conductive contact formed on a sidewall of the gate electrode and on a sidewall of the capping pattern, the conductive contact penetrating the interlayer insulating film,
wherein the etching stop layer extends at least partially along parts of sidewalls of the conductive contact, and
the capping pattern includes silicon oxide or a low-k material having a lower permittivity than silicon oxide.

11. The semiconductor device of claim 10, further comprising:
a gate spacer on a sidewall of the gate electrode,
wherein the lower portion of the trench is defined by a top surface of the substrate and a sidewall of the gate spacer.

12. The semiconductor device of claim 10, wherein a sidewall of the capping pattern adjacent to the conductive contact includes a first sidewall portion and a second sidewall portion, which is formed above the first sidewall portion and has a smaller slope than the first sidewall portion.

13. The semiconductor device of claim 12, wherein the conductive contact includes an extension portion, which extends along the first sidewall portion of the capping pattern, and an expanded portion, which is formed on the extension portion and extends along the second sidewall portion of the capping pattern, and
a width of the expanded portion is greater than a width of the extension portion.

14. The semiconductor device of claim 12, wherein the etching stop layer extends along a sidewall of the upper portion of the trench adjacent to the interlayer insulating film, along the top surface of the gate electrode, and along the first sidewall portion.

15. The semiconductor device of claim 10, wherein the interlayer insulating film and the capping pattern include substantially the same material.

16. The semiconductor device of claim 10, wherein the substrate includes a fin-type pattern, which extends in a first direction, and
the gate electrode extends in a second direction that intersects the first direction.

17. The semiconductor device of claim 16, further comprising:
epitaxial patterns on sidewalls of the gate electrode and in the fin-type pattern,
wherein the conductive contact is electrically connected to the epitaxial patterns.

18. A semiconductor device comprising:
a substrate;
a gate electrode on the substrate;
a gate spacer on a sidewall of the gate electrode;
a capping pattern covering a top surface of the gate electrode and a top surface of the gate spacer;
an interlayer insulating film formed on the substrate and adjacent to the gate spacer and the capping pattern;
a conductive contact penetrating the interlayer insulating film, and defined by a sidewall of the gate spacer and a sidewall of the capping pattern,
wherein the capping pattern and the interlayer insulating film include substantially the same material; and
a sidewall of the capping pattern adjacent to the conductive contact includes a first sidewall portion and a second sidewall portion, which is formed above the first sidewall portion and has a smaller slope than the first sidewall portion.

19. The semiconductor device of claim 18, further comprising:
an etching stop layer extending along a sidewall of the interlayer insulating film and along a bottom surface and the first sidewall portion of the capping pattern.

20. The semiconductor device of claim 19, wherein the etching stop layer further extends along the second sidewall portion of the capping pattern.

* * * * *